United States Patent
Tsukada et al.

(10) Patent No.: US 10,066,319 B2
(45) Date of Patent: Sep. 4, 2018

(54) GAN SUBSTRATE, METHOD FOR PRODUCING GAN SUBSTRATE, METHOD FOR PRODUCING GAN CRYSTAL, AND METHOD FOR MANUFACTURING SEMICONDUCTOR DEVICE

(71) Applicant: MITSUBISHI CHEMICAL CORPORATION, Tokyo (JP)

(72) Inventors: Yusuke Tsukada, Ushiku (JP); Satoru Nagao, Ushiku (JP); Kazunori Kamada, Ushiku (JP); Masayuki Tashiro, Ushiku (JP); Kenji Fujito, Ushiku (JP); Hideo Fujisawa, Ushiku (JP); Yutaka Mikawa, Ushiku (JP); Tetsuharu Kajimoto, Ushiku (JP); Takashi Fukada, Ushiku (JP)

(73) Assignee: MITSUBISHI CHEMICAL CORPORATION, Tokyo (JP)

( * ) Notice: Subject to any disclaimer, the term of this patent is extended or adjusted under 35 U.S.C. 154(b) by 76 days.

(21) Appl. No.: 15/210,150

(22) Filed: Jul. 14, 2016

(65) Prior Publication Data
US 2016/0319460 A1 Nov. 3, 2016

Related U.S. Application Data

(63) Continuation of application No. PCT/JP2014/082859, filed on Dec. 11, 2014.

(30) Foreign Application Priority Data

Jan. 17, 2014 (JP) ................................ 2014-006907
Apr. 24, 2014 (JP) ................................ 2014-090535
(Continued)

(51) Int. Cl.
*C30B 29/38* (2006.01)
*C30B 25/20* (2006.01)
(Continued)

(52) U.S. Cl.
CPC .............. *C30B 25/20* (2013.01); *C30B 7/005* (2013.01); *C30B 7/105* (2013.01); *C30B 23/025* (2013.01);
(Continued)

(58) Field of Classification Search
CPC .......... C30B 29/38; C30B 23/00; C30B 25/00
See application file for complete search history.

(56) References Cited

U.S. PATENT DOCUMENTS 7,033,436 B2 * 4/2006 Biwa ....................... C30B 25/02
117/102
9,829,778 B2 * 11/2017 Raring ................. H04N 9/3129
(Continued)

FOREIGN PATENT DOCUMENTS

CN 101522962 A 9/2009
CN 103348044 A 10/2013
(Continued)

OTHER PUBLICATIONS

Po Shan Hsu, et al., "Stress relaxation and critical thickness for misfit dislocation formation in (1010) and (3031) InGaN/GaN heteroepitaxy", *Applied Physics Letters*, 2012, pp. 171917-1 to 171917-4, vol. 100 (previously submitted in the IDS filed Jul. 14, 2016).

(Continued)

*Primary Examiner* — Robert M Kunemund
(74) *Attorney, Agent, or Firm* — Leason Ellis LLP

(57) ABSTRACT

A disc-like GaN substrate is a substrate produced by a tiling method and having an angel between the normal line and m-axis on the main surface of the substrate of 0 to 20° inclusive and a diameter of 45 to 55 mm, to 4 or less. In a preferred embodiment, a disc-like GaN substrate has a first main surface and a second main surface that is opposite to the first main surface, and which has an angle between the
(Continued)

normal line and m-axis on the first main surface of 0 to 20° inclusive and a diameter of 45 mm or more. The disc-like GaN substrate comprises at least four crystalline regions each being exposed to both of the first main surface and the second main surface, wherein the four crystalline regions are arranged in line along the direction of the orthogonal projection of c-axis on the first main surface.

13 Claims, 17 Drawing Sheets

(30) Foreign Application Priority Data

| May 20, 2014 | (JP) | 2014-104383 |
|---|---|---|
| Jun. 9, 2014 | (JP) | 2014-118851 |
| Jun. 13, 2014 | (JP) | 2014-122520 |
| Aug. 7, 2014 | (WO) | PCT/JP2014/070919 |
| Aug. 21, 2014 | (JP) | 2014-168565 |

(51) Int. Cl.
| H01L 33/32 | (2010.01) |
|---|---|
| C30B 29/40 | (2006.01) |
| H01L 21/02 | (2006.01) |
| C30B 7/00 | (2006.01) |
| C30B 7/10 | (2006.01) |
| H01L 33/00 | (2010.01) |
| C30B 23/02 | (2006.01) |
| H01L 29/20 | (2006.01) |

(52) U.S. Cl.
CPC ........ *C30B 29/406* (2013.01); *H01L 21/0254* (2013.01); *H01L 21/02389* (2013.01); *H01L 21/02433* (2013.01); *H01L 21/02642* (2013.01); *H01L 21/02647* (2013.01); *H01L 33/0075* (2013.01); *H01L 33/32* (2013.01); *H01L 21/0262* (2013.01); *H01L 29/2003* (2013.01)

(56) References Cited

U.S. PATENT DOCUMENTS

| 2004/0187766 A1 | 9/2004 | Letertre |
|---|---|---|
| 2004/0244680 A1 | 12/2004 | Dwilinski et al. |
| 2004/0245535 A1 | 12/2004 | D'Evelyn et al. |
| 2005/0087124 A1 | 4/2005 | Dwilinski et al. |
| 2005/0214992 A1 | 9/2005 | Chakraborty et al. |
| 2007/0261633 A1 | 11/2007 | Tanaka |
| 2007/0290228 A1 | 12/2007 | Yoshida |
| 2008/0081015 A1 | 4/2008 | Sarayama et al. |
| 2009/0236694 A1 | 9/2009 | Mizuhara et al. |
| 2010/0104495 A1 | 4/2010 | Kawabata et al. |
| 2011/0248281 A1 | 10/2011 | Oshima et al. |
| 2012/0034763 A1 | 2/2012 | Osada et al. |
| 2012/0068155 A1 | 3/2012 | Ishibashi |
| 2012/0112320 A1 | 5/2012 | Kubo et al. |
| 2012/0237431 A1 | 9/2012 | Mikawa et al. |
| 2012/0282443 A1 | 11/2012 | Fujito et al. |
| 2012/0315445 A1 | 12/2012 | Mizuhara et al. |
| 2012/0329245 A1 | 12/2012 | Uematsu et al. |
| 2013/0065036 A1 | 3/2013 | Hayashi et al. |
| 2013/0069078 A1 | 3/2013 | Sarayama et al. |
| 2013/0108537 A1 | 5/2013 | Mikawa et al. |
| 2013/0160699 A1 | 6/2013 | Mizuhara et al. |
| 2013/0284160 A1 | 10/2013 | Uchida et al. |
| 2013/0313567 A1 | 11/2013 | Furuya et al. |
| 2013/0337632 A1 | 12/2013 | Uematsu et al. |
| 2014/0035103 A1 | 2/2014 | Matsumoto et al. |
| 2014/0175616 A1 | 6/2014 | Mizuhara et al. |
| 2014/0369920 A1 | 12/2014 | Uematsu et al. |

FOREIGN PATENT DOCUMENTS

| CN | 103456593 A | 12/2013 |
|---|---|---|
| EP | 2514858 A | 10/2012 |
| EP | 2832901 A1 | 2/2015 |
| JP | 2006-315947 A | 11/2006 |
| JP | 2007-217216 A | 8/2007 |
| JP | 2007-331973 A | 12/2007 |
| JP | 2008-091837 A | 4/2008 |
| JP | 2008-110910 A | 5/2008 |
| JP | 2008-143772 A | 6/2008 |
| JP | 2009-018971 A | 1/2009 |
| JP | 2010-275171 A | 12/2010 |
| JP | 2011-016676 A | 1/2011 |
| JP | 2011-026181 A | 2/2011 |
| JP | 2011-063504 A | 3/2011 |
| JP | 2011-77382 A | 4/2011 |
| JP | 2011-129752 A | 6/2011 |
| JP | 2012-051746 A | 3/2012 |
| JP | 2012-138543 A | 7/2012 |
| JP | 2012-197218 A | 10/2012 |
| JP | 2012-231103 A | 11/2012 |
| JP | 2013-035711 A | 2/2013 |
| JP | 2013-075791 A | 4/2013 |
| JP | 2013-082611 A | 5/2013 |
| JP | 2013-209274 A | 10/2013 |
| JP | 2016-044094 A | 4/2016 |
| JP | 2016-69205 A | 5/2016 |
| WO | WO-2002/101125 A | 12/2002 |
| WO | WO-2011/065436 A | 6/2011 |
| WO | WO-2011/087061 A1 | 7/2011 |
| WO | WO-2014/035481 A1 | 3/2014 |

OTHER PUBLICATIONS

Hyun-Jae Lee, et al., "Self-separated freestanding GaN using a NH₄Cl interlayer", Applied Physics Letters, 2007, pp. 192108-1 to 192108-3, vol. 91 (previously submitted in the IDS filed Jul. 14, 2016).
International Preliminary Report on Patentability dated Feb. 18, 2016 for the corresponding PCT Application No. PCT/JP2014/070919 (previously submitted in the IDS filed Jul. 14, 2016).
Notification of Transmittal of Translation of the International Preliminary Report on Patentability dated Jul. 28, 2016 and International Preliminary Report on Patentability dated Jul. 19, 2016 for the corresponding PCT Application No. PCT/JP2014/082859.
Office Action dated Jul. 4, 2017 for the related Japanese Patent Application No. 2014-168566.
Po Shan Hsu, et al., "Stress relaxation and critical thickness for misfit dislocation formation in (100) and (30) InGaN/GaN heteroepitaxy", Applied Physics Letters, 2012, pp. 171917-1 to 171917-4, vol. 100.
Hyun-Jae Lee, et al., "Self-separated freestanding GaN using a N H 4 Cl interlayer", Applied Physics Letters, 2007, pp. 192108-1 to 192108-3, vol. 91.
International Search Report dated Mar. 3, 2015 for the corresponding PCT Application No. PCT/JP2014/082859.
International Search Report dated Oct. 28, 2014 for the corresponding PCT Application No. PCT/JP2014/070919.
International Preliminary Report on Patentability dated Feb. 9, 2016 for the corresponding PCT Application No. PCT/JP2014/070919.
Extended European Search Report dated Jun. 14, 2016 for the corresponding European Patent application No. 14834101.9.
Office Action dated Oct. 24, 2017 for the related Japanese Patent Application No. 2014-168566.
Office Action dated Dec. 5, 2017 for the related Japanese Patent Application No. 2014-198539.
Office Action dated Dec. 14, 2017 for the related Taiwanese Patent Application No. 103127186.
Office Action dated Dec. 4, 2017 for the corresponding Chinese Patent Application No. 201480073300.0.
Office Action dated May 2, 2018 for the related U.S. Appl. No. 15/016,409.

(56) References Cited

OTHER PUBLICATIONS

Office Action dated Apr. 12, 2018 for the corresponding Taiwanese patent application No. 103143621.
Extended European Search Report dated Mar. 29, 2018 for the related European patent application No. 17194202.2.

* cited by examiner

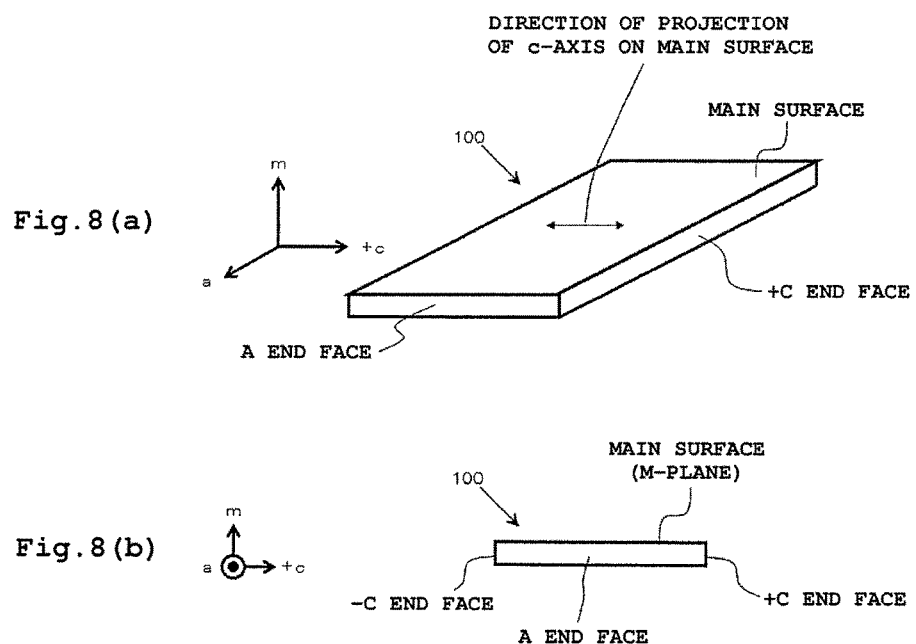

GAN SUBSTRATE, METHOD FOR PRODUCING GAN SUBSTRATE, METHOD FOR PRODUCING GAN CRYSTAL, AND METHOD FOR MANUFACTURING SEMICONDUCTOR DEVICE

CROSS-REFERENCE TO RELATED APPLICATION

This is a continuation of International Application PCT/JP2014/082859, filed on Dec. 11, 2014, and designated the U.S., (and claims priority from Japanese Patent Application 2014-006907 which was filed on Jan. 17, 2014, Japanese Patent Application 2014-090535 which was filed on Apr. 24, 2014, Japanese Patent Application 2014-104383 which was filed on May 20, 2014, Japanese Patent Application 2014- which was filed on Jun. 9, 2014, Japanese Patent Application 2014-122520 which was filed on Jun. 13, 2014, International Application PCT/JP2014/070919 which was filed on Aug. 7, 2014, and Japanese Patent Application 2014-168565 which was filed on Aug. 21, 2014) the entire contents of which are incorporated herein by reference.

TECHNICAL FIELD

The present invention relates to a GaN (gallium nitride) substrate, a method for producing a GaN substrate, a method for producing a GaN crystal, and a method for producing a semiconductor device.

GaN is one type of group III-V compound semiconductor, having a wurtzite-type crystal structure belonging to a hexagonal system.

GaN can be made conductive through doping with impurities. Known n-type impurities include O (oxygen), Si (silicon), Ge (germanium) and the like. Known p-type impurities include Mg (magnesium), Zn (zinc) and the like.

The use of non-polar or semi-polar GaN substrates is expected to result in improved nitride semiconductor devices (NPL 1). Nitride semiconductors are also referred to for instance as nitride-based group III-V compound semiconductors, group III nitride-based compound semiconductors and GaN-based semiconductors, and include GaN (gallium nitride) and also compounds where part or the entirety of Ga in GaN is substituted by other elements (B, Al and In) of group 13 of the periodic table. Examples thereof include, for instance, AlN, InN, AlGaN, AlInN, GaInN, AlGaInN and the like.

(10-10) substrates, i.e. M-plane substrates, have received particular attention among non-polar GaN substrates. Substrates being the object of particular attention among semi-polar GaN substrates include (20-21) substrates, (20-2-1) substrates, (30-31) substrates and (30-3-1) substrates.

Non-polar or semi-polar GaN substrates can be produced from a bulk GaN crystal having been grown in the c-axis direction, on a C-plane GaN template, by HVPE. Such a bulk GaN crystal is sliced parallelly to the desired non-polar or semi-polar plane. The thickness of bulk GaN crystals that can be grown by HVPE on a C-plane GaN template is ordinarily of several mm or less, and accordingly the size of the main surface, in the c-axis direction, of the non-polar or semi-polar GaN substrates that can be produced in accordance with such a method is of several mm or less. It is virtually impossible to obtain a large-area substrate, such as a 2-inch substrate (disk-shaped substrate having a 2-inch diameter) relying on this method.

Tiling methods have been proposed in order to solve this problem. Tiling methods rely on using aggregate seeds. The term aggregate seed denotes a plurality of seed substrates closely arrayed in the transversal direction in such a manner that the crystal orientations of the seed substrates are aligned. A bulk GaN crystal that constitutes one continuous layer is epitaxially grown, by a vapor phase method, on the aggregate seed made up of a plurality of seed substrates (PTL 1 to 4). A 2-inch M-plane GaN substrate (disk-shaped M-plane GaN substrate having a 2-inch diameter) can be realized by using an aggregate seed configured in the form of an assembly of a plurality of M-plane GaN substrates having a main surface size, in the c-axis direction, of less than several mm.

However, an M-plane seed substrate cut out of a bulk GaN crystal having been grown by HVPE on a C-plane GaN template exhibits a relatively high dislocation density on the main surface, from the $10^6$ cm$^{-2}$ level up to the $10^7$ cm$^{-2}$ level. In a case where the dislocation density is $1\times10^6$ cm$^{-2}$, an average of 100 dark spots, which denote the presence of dislocations, are observed within a 100 μm×100 μm field of view, in SEM-CL (scanning electron microscope-cathode luminescence).

Ammonothermal methods are known methods that allow growing a high-quality GaN crystal having few defects such as dislocations (PTL 5 and 6). In an ammonothermal method, a GaN crystal is caused to precipitate on a seed, using ammonia in a supercritical or subcritical state as a solvent.

However, there are as yet no known methods for efficiently producing, by an ammonothermal method, a non-polar or semi-polar GaN substrate having a main surface size, in the c-axis direction, in excess of 1 cm.

[Patent Literature 1] Japanese Patent Application Publication No. 2006-315947
[Patent Literature 2] Japanese Patent Application Publication No. 2008-143772
[Patent Literature 3] Japanese Patent Application Publication No. 2010-275171
[Patent Literature 4] Japanese Patent Application Publication No. 2011-026181
[Patent Literature 5] WO 2002/101125
[Patent Literature 6] WO 2011/065436
[Non Patent Literature 1] Po Shan Hsu, Matthew T. Hardy, Erin C. Young, Alexey E. Romanov, Steven P. DenBaars, Shuji Nakamura, and James S. Speck, Applied Physics Letters 100, 171917 (2012)

DISCLOSURE OF THE INVENTION

Non-polar or semi-polar substrates that are obtained through processing of GaN crystals produced by a tiling method are ordinarily made up of a plurality of crystal regions. In such substrates defect density tends to be higher at the boundaries between different crystal regions (PTL 2 to 4). Therefore, it is necessary to reduce the number of crystal regions that make up the substrate.

In the light of the above considerations, it is a main object of the present invention to provide a technology for realizing a non-polar or semi-polar GaN substrate, having a diameter of two or more inches, that includes a smaller number of crystal regions than in conventional art (for instance, a non-polar or semi-polar GaN substrate having a 2-inch diameter and made up of four or fewer crystal regions).

A further object of the present invention is to provide a non-polar or semi-polar GaN substrate having a 2-inch diameter and made up of a single crystal region.

Embodiments of the present invention include a GaN substrate, a method for producing a GaN crystal, and a method for producing a semiconductor device as described below.

(1) A GaN substrate, which is a disk-shaped GaN substrate having a diameter of 45 mm or more and which has a first main surface and a second main surface on an opposite side thereto, and in which an angle between a normal line of the first main surface and an m-axis is 0° to 20°, wherein the GaN substrate is made up of n (n being 2, 3 or 4) crystal regions each exposed at both the first main surface and second main surface; and wherein the n crystal regions are arrayed in one row in a direction of an orthogonal projection of a c-axis on the first main surface.

(2) The GaN substrate according to (1), wherein the diameter of the substrate is 55 mm or less.

(3) The GaN substrate according to (1) or (2), wherein a boundary between two adjacent crystal regions, arbitrarily selected from among the n crystal regions, and the orthogonal projection of the c-axis on the first main surface form an angle in a range of 90°±10° within the first main surface.

(4) The GaN substrate according to any one of (1) to (3), wherein there are no through-cracks defined in (A) below running through the substrate in a thickness direction, or even if present, the number of the through-cracks defined in (A) below in the first main surface is 10 or fewer per 20 $cm^2$, and there are no cracks of a type other than the through-cracks defined in (A) below: (A) a through-crack forming an angle with the orthogonal projection of the c-axis on the first main surface in a range of 90°±10° within the first main surface.

(5) The GaN substrate according to any one of (1) to (4), wherein when the first main surface is divided into an outer peripheral portion measuring 3 mm or less from an edge and a central portion surrounded by the outer peripheral portion, and the central portion is divided into a plurality of square partitions each having a 5 mm side, at least one square region, which has a 100 μm side and in which no dark spots are detected in a CL measurement, is observed within each of the partitions.

(6) The GaN substrate according to (5), wherein an average dislocation density in the central portion, obtained through averaging, excluding boundaries between mutually adjacent crystal regions, is lower than $10^5$ $cm^{-2}$.

(7) The GaN substrate according to any one of (1) to (6), wherein the first main surface is not a concave surface at room temperature.

(8) The GaN substrate according to (7), wherein the first main surface is a convex surface at room temperature.

(9) The GaN substrate according to (7) or (8), wherein a SORI value of the first main surface at room temperature is smaller than 20 μm.

(10) The GaN substrate according to any one of (1) to (9), wherein when the first main surface is divided into an outer peripheral portion measuring 3 mm or less from the edge and a central portion surrounded by the outer peripheral portion, a variation range of an off-angle in the central portion is smaller than 0.5° both for a component in a direction of the orthogonal projection of the c-axis on the first main surface and for a component in a direction perpendicular to the direction.

(11) The GaN substrate according to any one of (1) to (10), having stacking faults.

(12) The GaN substrate according to any one of (1) to (11), which comprises a GaN crystal having an alkali metal concentration lower than $1\times10^{15}$ $cm^{-3}$ and an absorption coefficient at 450 nm of 2 $cm^{-1}$ or smaller.

(13) A GaN substrate, which is a disk-shaped GaN substrate having a diameter of 45 mm or more and which is made up of a single crystal region, the GaN substrate having a first main surface and a second main surface on an opposite side thereto, and an angle between a normal line of the first main surface and an m-axis being 0° to 20°.

(14) The GaN substrate according to (13), wherein the diameter of the substrate is 55 mm or less.

(15) The GaN substrate according to (13) or (14), wherein the alkali metal concentration of the substrate is lower than $1\times10^{15}$ $cm^{-3}$.

(16) The GaN substrate according to any one of (13) to (15), which is made up of a GaN crystal having an absorption coefficient at the 450 nm wavelength of 2 $cm^{-1}$ or smaller.

(17) The GaN substrate according to any one of (13) to (16), wherein when the first main surface is divided into an outer peripheral portion measuring 3 mm or less from an edge and a central portion surrounded by the outer peripheral portion, and the central portion is divided into a plurality of square partitions each having a 5 mm side, at least one square region, which has a 100 μm side and in which no dark spots are detected in a CL measurement, is observed within each of the partitions.

(18) The GaN substrate according to (17), wherein an average dislocation density at the central portion is lower than $10^5$ $cm^{-2}$.

(19) The GaN substrate according to any one of (13) to (18), wherein the first main surface is not a concave surface at room temperature.

(20) The GaN substrate according to any one of (13) to (19), having stacking faults.

(21) A method for producing a GaN crystal, the method including: a step of preparing the GaN substrate of any one of (1) to (20), and epitaxially growing GaN thereon.

(22) The production method according to (21), which is a method for producing a bulk GaN crystal.

(23) A method for producing a GaN crystal, the method including: growing a first bulk GaN crystal using as a seed the GaN substrate according to any one of (1) to (20), and growing thereafter a second bulk GaN crystal using as a seed part or the entirety of the first bulk GaN crystal.

(24) A method for producing a semiconductor device, the method including: preparing the GaN substrate according to any one of (1) to (20), and growing thereon one or more types of nitride semiconductor layer.

Embodiments of the present invention include also a method for producing a GaN substrate below.

(a1) A production method, which is a method for producing a disk-shaped GaN substrate having a first main surface and a second main surface on the opposite side thereto, and in which an angle between a normal line of the first main surface and the m-axis is 0° to 20°, the method having: a first step of configuring an aggregate seed by closely arraying a plurality of seed substrates, each having a main surface, in such a manner that the main surfaces are coplanar; and a second step of vapor-phase growing a GaN crystal on the aggregate seed; wherein each of the plurality of seed substrates has an angle of 0° to 20° between a normal line of the main surface and the m-axis, and has a +C-end face and a −C-end face that intersect at an angle in the range of 90°±10° with an orthogonal projection of the c-axis on the main surface, the size of the main surface of at least one of the plurality of seed substrates being 55 mm or greater in a direction parallel to an intersection line of the +C-end face and the main surface and being 15 mm or greater in a direction perpendicular to the intersection line.

(a2) The production method according to (a1), wherein in each of the plurality of seed substrates, the orthogonal projection of the c-axis on the main surface intersects the +C-end face and the −C-end face at respective angles in the range of 90°±1°.

(a3) The production method according to (a1) or (a2), wherein the size of the main surface of all of the plurality of seed substrates is 55 mm or greater in a direction parallel to the intersection line of the +C-end face and the main surface and is 15 mm or greater in a direction perpendicular to the intersection line.

(a4) The production method according to any one of (a1) to (a3), wherein in the first step, the aggregate seed is configured by arraying the plurality of seed substrates in one row, two rows or three rows in the direction of the orthogonal projection of the c-axis on the main surface.

(a5) The production method according to (a4), wherein the diameter of the disk-shaped GaN substrate lies in the range of 45 mm to 55 mm, and in the first step, the aggregate seed is configured by arraying the plurality of seed substrates in one row in the direction of the orthogonal projection of the c-axis on the main surface.

(a6) The production method according to (a4), wherein the diameter of the disk-shaped GaN substrate lies in the range of 95 mm to 105 mm, and in the first step, the aggregate seed is configured by arraying the plurality of seed substrates in two rows in the direction of the orthogonal projection of the c-axis on the main surface.

(a7) The production method according to (a4), wherein the diameter of the disk-shaped GaN substrate lies in the range of 145 mm to 155 mm, and in the first step, the aggregate seed is configured by arraying the plurality of seed substrates in two rows or three rows in the direction of the orthogonal projection of the c-axis on the main surface.

(a8) The production method according to any one of (a1) to (a7), further having a step of obtaining a target disk-shaped GaN substrate through processing of the GaN crystal that is vapor-phase grown in the second step.

(a9) The production method according to any one of (a1) to (a7), further having a step of vapor-phase growing a further GaN crystal using, as a seed, at least part of the GaN crystal having been vapor-phase grown in the second step.

Embodiments of the present invention include also a GaN substrate described below.

(b1) A GaN substrate, which has a first main surface and a second main surface on an opposite side thereto, and in which an angle between a normal line of the first main surface and the m-axis is 0° to 20°, wherein the GaN substrate is made up of a plurality of crystal regions each exposed at both the first main surface and second main surface; and wherein defining a first direction as a direction of an orthogonal projection of the c-axis on the first main surface and a second direction as a direction perpendicular to the first direction, within the first main surface, the substrate size is 45 mm or greater in the first direction and in the second direction; and wherein the plurality of crystal regions is arrayed in one row along the first direction, with at least one having a size of 15 mm or greater along the first direction.

(b2) The GaN substrate according to (b1), wherein all of the plurality of crystal regions have a size of 15 mm or greater along the first direction.

(b3) The GaN substrate according to (b1) or (b2), wherein the substrate size is 55 mm or smaller in the first direction and in the second direction.

(b4) The GaN substrate according to any one of (b1) to (b3), which is disk-shaped.

(b5) A GaN substrate, which has a first main surface and a second main surface on the opposite side thereto, and in which an angle between a normal line of the first main surface and the m-axis is 0° to 20°, wherein the GaN substrate is made up of a plurality of crystal regions each exposed at both the first main surface and second main surface; and defining a first direction as a direction of the orthogonal projection of the c-axis on the first main surface and a second direction as a direction perpendicular to the first direction within the first main surface, the substrate size is 95 mm or greater in both the first direction and the second direction; and the plurality of crystal regions is arrayed in two or three rows along the first direction, with at least one having a size of 15 mm or greater along the first direction.

(b6) The GaN substrate according to (b5), wherein all of the plurality of crystal regions have a size of 15 mm or greater along the first direction.

(b7) The GaN substrate according to (b5) or (b6), wherein the plurality of crystal regions is arrayed in two rows along the first direction.

(b8) The GaN substrate according to any one of (b5) to (b7), wherein the substrate size is 155 mm or smaller in the first direction and in the second direction.

(b9) The GaN substrate according to (b8), wherein the substrate size is 105 mm or smaller in the first direction and in the second direction.

(b10) The GaN substrate according to any one of (b5) to (b9), which is disk-shaped.

(b11) The GaN substrate according to any one of (b1) to (b10), wherein a boundary between two arbitrarily selected crystal regions that are adjacent in the direction of the orthogonal projection of the c-axis on the first main surface, from among the plurality of crystal regions, and the orthogonal projection of the c-axis on the first main surface, form an angle in the range of 90°±10° within the first main surface.

(b12) The GaN substrate according to any one of (b1) to (b11), wherein when the first main surface is divided into an outer peripheral portion measuring 3 mm or less from an edge and a central portion surrounded by the outer peripheral portion, and the central portion is divided into a plurality of square partitions each having a 5 mm side, at least one square region, which has a 100 μm side and in which no dark spots are detected in a CL measurement, is observed within each of the partitions (b13) The GaN substrate according to (12), wherein an average dislocation density in the central portion, obtained through averaging excluding boundaries between mutually adjacent crystal regions, is lower than $10^5$ cm$^{-2}$.

(b14) The GaN substrate according to any one of (b12) to (b13), which comprises a GaN crystal having an alkali metal concentration lower than $1\times10^{15}$ cm$^{-3}$ and an absorption coefficient at 450 nm of 2 cm$^{-1}$ or smaller.

Embodiments of the present invention include also a GaN substrate described below.

(c1) A GaN substrate, which is a disk-shaped GaN substrate having a diameter of 95 mm to 105 mm and which has a first main surface and a second main surface on an opposite side thereto, and in which an angle between a normal line of the first main surface and the m-axis is 0° to 20°, wherein the GaN substrate is made up of a plurality of crystal regions each exposed at both the first main surface and second main surface; and the plurality of crystal regions is arrayed in two rows along the direction of an orthogonal projection of the c-axis on the first main surface, the number of crystal regions in each row being 2 to 8.

(c2) The GaN substrate according to (c1), wherein the number of crystal regions in each row is 2 to 4.

(c3) A GaN substrate, which is a disk-shaped GaN substrate having a diameter of 145 mm to 155 mm and which has a first main surface and a second main surface on an opposite side thereto, and in which an angle between a normal line of the first main surface and the m-axis is 0° to 20°, wherein the GaN substrate is made up of a plurality of crystal regions each exposed at both the first main surface and second main surface; and the plurality of crystal regions is arrayed in two rows or three rows along the direction of an orthogonal projection of the c-axis on the first main surface, the number of crystal regions in each row being 3 to 12.

(c4) The GaN substrate according to (c3), wherein the plurality of crystal regions is arrayed in two rows along the direction of the orthogonal projection of the c-axis on the first main surface.

(c5) The GaN substrate according to (c3) or (c4), wherein the number of crystal regions in each row is 3 to 6.

(c6) The GaN substrate according to any one of (c1) to (c5), wherein a boundary between two arbitrarily selected crystal regions that are adjacent in the direction of the orthogonal projection of the c-axis on the first main surface, from among the plurality of crystal regions, and the orthogonal projection of the c-axis on the first main surface, form an angle in the range of 90°±10° within the first main surface.

(c7) The GaN substrate according to any one of (c1) to (c6), wherein when the first main surface is divided into an outer peripheral portion measuring 3 mm or less from an edge and a central portion surrounded by the outer peripheral portion, and the central portion is divided into a plurality of square partitions each having a 5 mm side, at least one square region, which has a 100 µm side and in which no dark spots are detected in a CL measurement, is observed within each of the partitions.

(c8) The GaN substrate according to (c7), wherein an average dislocation density in the central portion, obtained through averaging excluding boundaries between mutually adjacent crystal regions, is lower than $10^5$ cm$^{-2}$.

(c9) The GaN substrate according to any one of (c1) to (c8), which comprises a GaN crystal having an alkali metal concentration lower than $1 \times 10^{15}$ cm$^{-3}$ and an absorption coefficient at 450 nm of 2 cm$^{-2}$ or smaller.

The invention provides a technology for realizing a non-polar or semi-polar GaN substrate having a diameter of 2 inches or greater that includes a smaller number of crystal regions than in conventional art (for instance, a non-polar or semi-polar GaN substrate having a 2-inch diameter and made up of four or fewer crystal regions).

In a preferred embodiment there is provided a non-polar or semi-polar GaN substrate having a 2-inch diameter and made up of a single crystal region.

BRIEF DESCRIPTION OF THE DRAWINGS

FIG. 1 is a set of diagrams illustrating a GaN substrate according to an embodiment, where

FIG. 3 is a set of diagrams illustrating a GaN substrate according to an embodiment, where

FIG. 7 is set of diagrams explaining a slowdown in the growth rate of a GaN crystal as a result of the appearance, on the surface, of a stable facet that is tilted with respect to the growth direction, where

FIG. 8 is a set of diagrams illustrating a shape example of a seed substrate that is used in a tiling method, where FIG. 8(a) is a perspective-view diagram and FIG. 8(b) is a side-view diagram viewed from the side of an A-end face;

FIG. 10 is a set of diagrams illustrating a cross-section, after lapping and CMP, of a plurality of seed substrates fixed to a plate, where

FIG. 12 illustrates epitaxial growth of a GaN crystal on an aggregate seed made up of four seed substrates, where

FIG. 16 is set of cross-sectional diagrams illustrating schematically a process of slicing a GaN substrate from a bulk GaN crystal, where FIG. 17 is a set of diagrams illustrating a GaN substrate according to an embodiment, where

BEST MODE FOR CARRYING OUT THE INVENTION

Figure 1A:
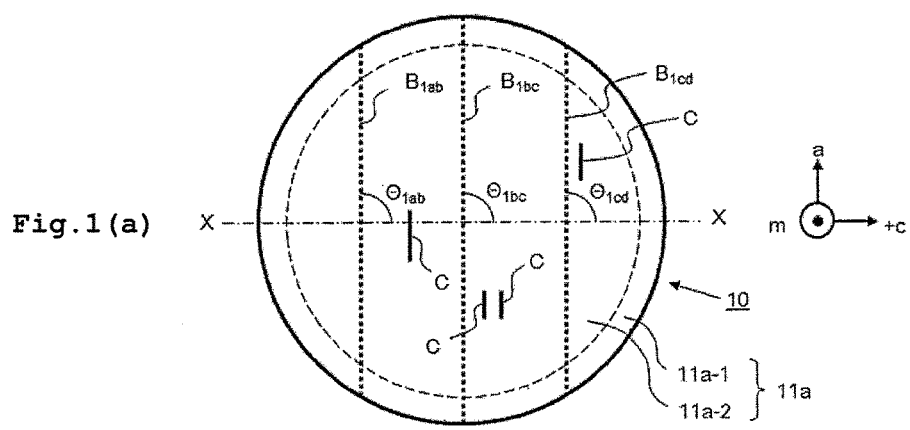
FIG. 1(a) is a plan-view diagram and FIG. 1(b) is a cross-sectional diagram of FIG. 1(a) at the position of line X-X.

In GaN crystals, the crystal axis parallel to [0001] is called the c-axis, the crystal axis parallel to [10-10] is called the m-axis, and the crystal axis parallel to [11-20] is called the a-axis. The crystal plane perpendicular to the c-axis is called the C-plane, the crystal plane perpendicular to the m-axis is called the M-plane, and the crystal plane perpendicular to the a-axis is called the A-plane.

Unless otherwise specified, the terms crystal axis, crystal plane, crystal orientation and so forth in the present description denote the crystal axis, crystal plane, crystal orientation and so forth of a GaN crystal.

The designations of crystal planes or Miller indices appended to the name of a GaN substrate denote a low-index plane that is parallel to, or most closely parallel to, the front surface of the substrate. The term front surface denotes the surface that is intended for use in formation of a semiconductor device or in epitaxial growth of a crystal, from among the two main surfaces of the substrate. The main surface that is not the front surface is referred to as the back surface.

For instance, a GaN substrate in which the low-index plane parallel to, or most closely parallel to, the front surface is the M-plane, i.e. (10-10), is referred to as an M-plane substrate or (10-10) substrate. Crystal planes in which the absolute values of all the integers h, k, m and l of the Miller indices (hkml) are 3 or less are ordinarily considered as low-index planes.

The GaN substrate of the present invention is a self-standing substrate made up of a GaN crystal alone. It suffices that the GaN substrate of the present invention has a thickness that enables the substrate to be handled as a self-standing substrate. In the case of a disk-shaped GaN substrate having a 2-inch diameter, the minimum thickness necessary for allowing the substrate to be handled as a self-standing substrate ranges ordinarily from 150 to 200 µm; preferably the thickness is 250 µm or greater and more preferably 280 µm or greater. The upper limit of the thickness of the GaN substrate of the present invention is not particularly limited, but is ordinarily 1 mm or smaller. In the case of a 2-inch substrate, the upper limit of the thickness is preferably 400 µm or smaller.

In the GaN substrate of the present invention, the angle between the normal line of the front surface and the m-axis lies in the range of 0 degrees to 20 degrees. In other words, front surface of the GaN substrate of the present invention is parallel to a crystal plane the inclination angle whereof from the M-plane lies in the range of 0 degrees to 20 degrees.

For instance, the angle formed with respect to the m-axis lies in the range of 0 degrees to 20 degrees in the case of [10-10], [20-21], [20-2-1], [30-31] and [30-3-1]. Therefore, a (10-10) substrate, a (20-21) substrate, a (20-2-1) substrate, a (30-31) substrate and a (30-3-1) substrate are encompassed among GaN substrates in which the angle between the normal line of the front surface and the m-axis lies in the range of 0 degrees to 20 degrees.

The present invention will be explained next in detail by way of embodiments.

1. GaN Substrate

1.1. First Embodiment

Figure 1B:
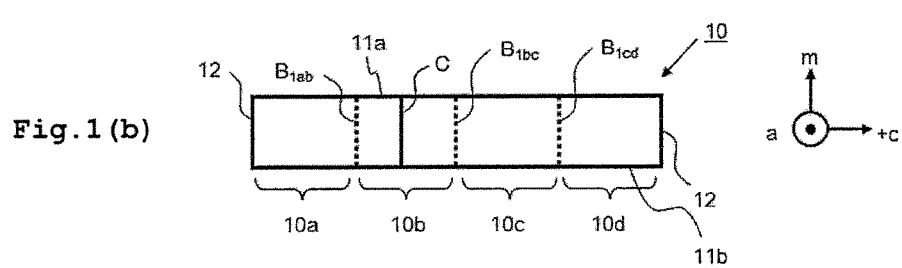

FIG. 1 illustrates a GaN substrate according to a first embodiment. FIG. 1($a$) is a plan-view diagram in which a substrate is viewed in the direction of the normal line of a main surface thereof, and FIG. 1($b$) is a cross-sectional diagram of FIG. 1($a$) at the position of line X-X. The cross-section illustrated in FIG. 1($b$) is a cross-section perpendicular to the main surface.

A GaN substrate 10 illustrated in FIG. 1 is a plate having a disk shape, i.e. having a circular main surface. The GaN substrate 10 has a first main surface 11$a$ and a second main surface 11$b$ on the opposite side thereto, and has an end face 12.

The first main surface 11$a$ is a surface intended for being used for formation of a semiconductor device or for epitaxial growth of a crystal (i.e. front surface). The first main surface 11$a$ is finished to a flat surface suitable for these purposes. Specifically, the RMS roughness of the first main surface as measured by AFM is ordinarily smaller than 5 nm, preferably smaller than 2 nm and more preferably smaller than 1 nm, in a measurement area of 10 µm×10 µm.

The first main surface 11$a$ is parallel to the M-plane, and accordingly the GaN substrate 10 is an M-plane substrate.

The diameter of the first main surface 11$a$ lies in the range of 45 to 55 mm, and may be, for instance, 2 inches (50 mm).

The GaN substrate 10 is cut out of a GaN crystal produced in accordance with a tiling method, and includes four crystal regions 10$a$, 10$b$, 10$c$, 10$d$ arrayed in a row in the c-axis direction. The c-axis is a crystal axis parallel to [0001].

All the four crystal regions 10$a$, 10$b$, 10$c$, 10$d$ are exposed at both the first main surface 11$a$ and the second main surface 11$b$.

In FIG. 1($a$) the boundaries between adjacent crystal regions appearing on the first main surface 11$a$ are depicted with dotted lines. In FIG. 1($b$) the boundaries between adjacent crystal regions appearing on a cross-section are similarly depicted with dotted lines.

A boundary $B_{1ab}$ is present between the crystal regions 10$a$ and 10$b$, a boundary $B_{1bc}$ is present between the crystal regions 10$b$ and 10$c$, and a boundary $B_{1cd}$ is present between the crystal regions 10$c$ and 10$d$.

In FIG. 1($a$), angles $\Theta_{1ab}$, $\Theta_{1bc}$ and $\Theta_{1cd}$ lie in the range of 80 to 100°, taking line X-X as parallel to the c-axis. That is, the boundaries $B_{1ab}$, $B_{1bc}$ and $B_{1cd}$ extend in directions that form an angle in the range of 90°±10° with the c-axis. The range of an angle formed by an extending direction of each of the boundaries $B_{1ab}$, $B_{1bc}$, $B_{1cd}$ and the c-axis is preferably 90°±5°, and more preferably 90°±1°.

Figure 2:
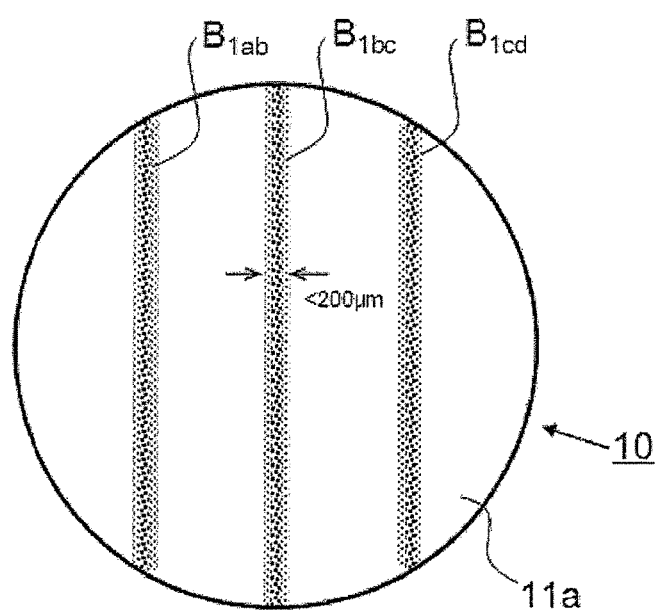
FIG. 2 is a plan-view diagram illustrating a GaN substrate according to an embodiment.

The boundaries $B_{1ab}$, $B_{1bc}$ and $B_{1cd}$ between adjacent crystal regions appear as schematically shown in FIG. 2 on the first main surface 11$a$ in the form of band-like regions having locally higher dislocation density, in a cathode luminescence (CL) image. The width of the band-like regions is ordinarily smaller than 200 µm, preferably smaller than 100 µm.

Photoluminescence (PL) intensity drops relatively at regions of high dislocation density, and hence the boundaries between adjacent crystal regions may be ascertained through PL mapping of the first main surface 11$a$.

In most cases the crystal orientation varies slightly between adjacent crystal regions, with the crystal orientation changing discontinuously at the boundary. Sites of discontinuous change in crystal orientation can be detected for instance through X-ray topography analysis of the first main surface 11$a$.

As illustrated in FIG. 1($a$), when the first main surface 11$a$ is divided into an outer peripheral portion 11$a$-1 (outward of the long dashed line) measuring 3 mm or less from the edge and a central portion 11$a$-2 (inward of the long dashed line) surrounded by the outer peripheral portion, the dislocation density of the central portion 11$a$-2, averaged by excluding the boundaries $B_{1ab}$, $B_{1bc}$ and $B_{1cd}$ between adjacent crystal regions, is lower than $10^5$ cm$^{-2}$.

Dislocation density can be evaluated on the basis of an ordinary CL measurement. Dislocations are observed as dark spots in a CL image.

If an average dislocation density lower than $10^5$ cm$^{-2}$ is realized in a central portion of the first main surface, then at least one square region having a 100 µm side and in which no dark spots are detected in a CL measurement is often observed within each partition, having a 5 mm side, of a plurality of square partitions into which the central portion is divided.

The outer peripheral portion 11a-1 is a portion that is generally not used in the production of a semiconductor device. Also the dislocation density of the outer peripheral portion is preferably low.

Further, the stacking fault density in the central portion 11a-2 of the first main surface, averaged by excluding the boundaries $B_{1ab}$, $B_{1bc}$ and $B_{1cd}$ between adjacent crystal regions, is preferably 20 cm$^{-1}$ or lower, more preferably 10 cm$^{-1}$ or lower and most preferably 1 cm$^{-1}$ or lower.

The reasons for the above ranges will be explained on the basis of an example in which a 0.5 mm square (500 µm×500 µm) LED chip is formed on the first main surface. A chip size of 0.5 mm square is a typical size that can be used in high-power LED chips that utilize GaN substrates.

400 is the number of 0.5 mm square LED chips that can be formed within a rectangular area of 1 cm×1 cm on the first main surface. The influence of stacking faults on "yield", i.e. on the proportion of good chips from among the 400 LED chips, is calculated under the following assumptions for the sake of simplicity.

The 1 cm×1 cm rectangular area is enclosed by straight lines parallel to the c-axis and straight lines parallel to the a-axis.

Stacking faults are formed parallelly to the a-axis.

Only one stacking fault having a length smaller than 1 cm is formed within the 1 cm×1 cm area.

The spacing between stacking faults is 500 µm or greater.

When a stacking fault is present in the region at which the LED chip is formed, that LED chip is considered as defective. Only LED chips having absolutely no stacking faults in the regions in which the LED chips are formed are considered as good (therefore, 400 good chips are obtained from a 1 cm×1 cm area if the stacking faults are zero).

When under the above assumptions the stacking fault density is 0.1 cm$^{-1}$, there is one stacking fault having a length of 0.1 cm (=1000 µm) within a 1 cm×1 cm area. Accordingly, there are two defective LED chips, which translates into a yield of (400−2)/400=99.5%.

When the stacking fault density is 1 cm$^{-1}$ there is one stacking fault having a length of 1 cm within the 1 cm×1 cm area. Accordingly, there are 20 defective chips, which translates into a yield of (400−20)/400=95%.

When the stacking fault density is 10 cm$^{-1}$ there are 10 stacking faults having a length of 1 cm within the 1 cm×1 cm area. This translates into 200 defective chips, since the spacing between stacking faults is 500 µm or greater. The yield is therefore (400−200)/400=50%.

Figure 15:
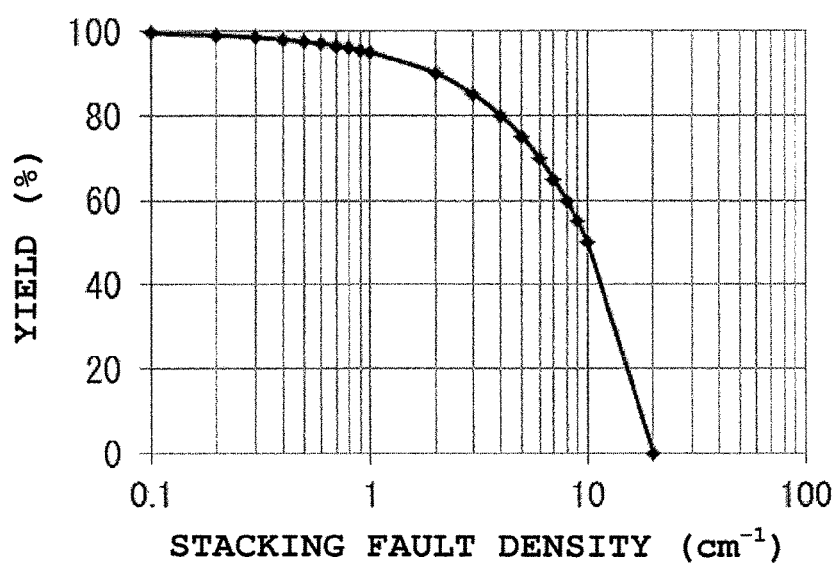
FIG. 15 is a graph illustrating the relationship between stacking fault density in a GaN substrate and LED chip yield as calculated under several assumptions.

A graph such as the one of FIG. 15 is obtained when plotting, in the form of a graph, the relationship between stacking fault density and LED chip yield thus calculated.

The length of the stacking faults present on the first main surface can be investigated by growing a GaN thin film by MOCVD, on the first main surface, and observing the surface of the thin film by optical microscopy. The GaN thin film may be grown for instance to a thickness of 2 µm, using nitrogen gas as a carrier gas, under conditions that include ammonia flow rate: 10 slm, trimethyl gallium supply rate: 206 µmol/min, pressure: 12.5 kPa, and substrate temperature: 1040° C. Level differences corresponding to the stacking faults are formed on the surface of the GaN thin film, and hence the length of the stacking faults can be obtained by measuring the length of the level differences through observation by optical microscopy.

Through-cracks C are present in the GaN substrate 10. The through-cracks C are cracks running through the substrate in the thickness direction, with the angle formed by the through-cracks C and the c-axis lying in the range of 90°±10° within the first main surface 11a.

The through-cracks C cannot be usually plugged even when depositing an epitaxial thin film for a semiconductor device on the GaN substrate 10. Resist solutions leak through these through-cracks; hence epitaxial substrates having numerous through-cracks make semiconductor processing difficult, and are thus problematic.

The number of the through-cracks C in the first main surface 11a is preferably 10 or fewer, more preferably 5 or fewer, per 20 cm$^2$. An area of 20 cm$^2$ is the area of a circle having a diameter of 2 inches, i.e. the area of the main surface of a 2-inch substrate. Most preferably, there are no through-cracks C in the first main surface 11a.

Preferably, cracks of type other than the through-cracks C are absent in the first main surface 11a.

When used for growing a nitride semiconductor by MOVPE or the like, the GaN substrate is placed on a susceptor in a vapor phase growth apparatus, and is heated via the susceptor. When the back surface of the GaN substrate is extremely convex, therefore, the contact area with the susceptor decreases, and in-plane distribution of the substrate temperature becomes nonuniform.

The front surface and the back surface of the GaN substrate are ordinarily parallel, with a TTV (Total Thickness Variation) of 5 µm or less in a case where the diameter of the GaN substrate lies in the range of 45 to 55 mm. When the front surface is concave, therefore, the back surface is a convex surface, and in-plane uniformity of the temperature is poorer during heating via the susceptor.

Preferably, therefore, the first main surface 11a of the GaN substrate 10 is not a concave surface at room temperature. The first main surface 11a may be a convex surface, but is not limited thereto.

Herein, the state of the first main surface 11a being a concave surface signifies that contour lines of the first main surface adopt multiple ring shapes, with lower height denoted by contour lines positioned further inward. Conversely, the feature of the first main surface 11a being a convex surface signifies that contour lines of the first main surface adopt multiple ring shapes, with greater height denoted by contour lines positioned further inward. The reference plane of the height of the first main surface is a least-squares plane of the first main surface.

Multiple ring shapes are a broader concept of concentric circles. The contour lines that constitute the multiple ring shape need not be necessarily circular, and it suffices that each of the contour lines be ring-shaped. Further, the ring-like shaped lines may have portions bulging inward.

The contour lines of the first main surface 11a of the GaN substrate 10 can be measured using a measurement instrument such as a laser oblique-incidence interferometer. The same is true of the SORI value described below.

The SORI value is one indicator for quantifying the degree of warping of a substrate. Taking the least-squares plane of the front surface of the substrate as a height reference plane, the SORI value is the total-sum value of the distance between the highest point on the front surface and the reference plane, and the distance between the lowest point on the front surface and the reference plane. As can be grasped from the definition, the SORI value does not take on a negative value.

In a case where the SORI value is excessively large, the contact area between the second main surface and the susceptor becomes smaller, even if the first main surface is not a concave surface, and in-plane uniformity of the temperature during heating via the susceptor may be impaired. Therefore, the SORI value at room temperature of the first main surface 11a is preferably smaller than 20 µm, more preferably smaller than 15 µm and most preferably smaller than 10 µm, for a diameter of the GaN substrate 10 in the range of 45 to 55 mm.

A 3 mm peripheral part of the first main surface is excluded when determining the SORI value. That is because in some instances the front surface and the back surface are not parallel on account of end portions processing or the like.

The variation range of the off-angle of the central portion 11a-2 of the first main surface, both for the component in the c-axis direction and for the component in a direction perpendicular to the c-axis, is ordinarily smaller than 0.5°, preferably smaller than 0.3° and more preferably smaller than 0.2°. The variation range of the off-angle denotes herein 2α, where θ is the median, θ+α is the maximum value and θ−α is the minimum value, for each of components of the off-angle.

The off-angle of an M-plane substrate is the inclination of the normal line of the front surface with respect to the m-axis, and can be defined at an arbitrary position on the front surface. As described above, the front surface is the main surface intended for being used in the formation of a semiconductor device or in epitaxial growth of a crystal.

The off-angle of the front surface of the GaN substrate 10 can be offset deliberately from 0°. In this case, the c-axis direction in the explanation above can be read as "direction of an orthogonal projection of a c-axis on the first main surface".

The damaged layer that is formed through mechanical polishing is removed from the first main surface 11a of the GaN substrate 10.

The residual damaged layer can be ascertained on the basis of an emission spectrum of the main surface as obtained by a photoluminescence measurement. When a residual damaged layer is present, the emission spectrum exhibits a broad peak in the visible wavelength region. This broad emission peak, which is referred to as a yellow band, appears in a wavelength region that includes wavelengths (550 to 580 nm) corresponding to yellow light.

When the damaged layer is removed there decreases the ratio of intensity of the yellow band with respect to the intensity of the peak of the wavelength corresponding to the band gap of GaN, in the above emission spectrum. The above ratio is preferably lower than ⅕, more preferably lower than ¹⁄₁₀.

The second main surface 11b of the GaN substrate 10 may be a mirror surface or a matte surface.

When the second main surface 11b is a matte surface, the latter can be easily distinguished visually from the first main surface 11a.

The damaged layer formed by mechanical working is removed from the second main surface 11b as well. The GaN surface planarized by mechanical polishing can be made into a mirror surface, having no damaged layer, by CMP finishing. A GaN surface having undergone coarse mechanical polishing or an as-sliced GaN surface can be made into a matte surface, having no damaged layer, by dry etching.

In a preferred embodiment, the number of crystal regions that make up the GaN substrate 10 can be reduced to three, and even further to two.

As the number of crystal regions decreases, the boundaries between adjacent crystal regions become fewer, and hence crystal defects caused by stress generated at the boundaries become fewer as well.

The first embodiment of the present invention has been thus explained above. In an alternative embodiment, a low-index plane that is parallel to, or most closely parallel to, the first main surface 11a of the GaN substrate 10 can be set to a crystal plane oblique with respect to the M-plane, for instance the (30-31) plane, (30-3-1) plane, (20-21) plane, (20-2-1) plane or the like. In a case where in such an alternative embodiment the inclination of the normal line of the first main surface with respect to the m-axis includes a c-axis direction component, the term c-axis direction in the explanation of the first embodiment above is replaced by "direction of the orthogonal projection of the c-axis on the first main surface".

1.2. Second Embodiment

Figure 3A:
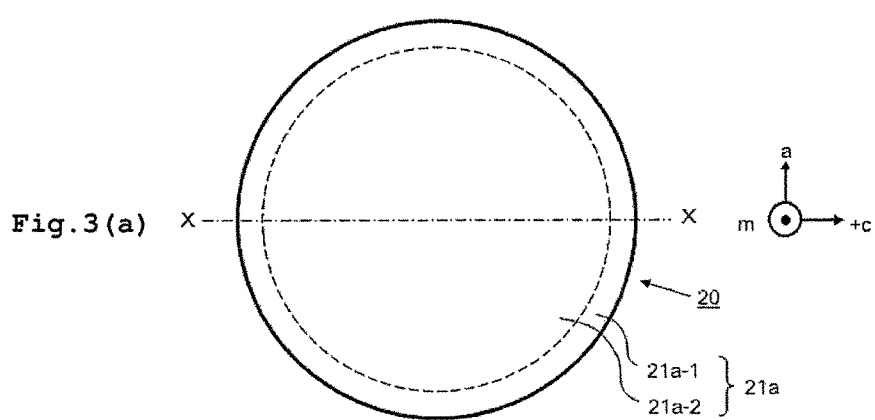
FIG. 3(a) is a plan-view diagram and FIG. 3(b) is a cross-sectional diagram of FIG. 3(a) at the position of line X-X.
Figure 3B:
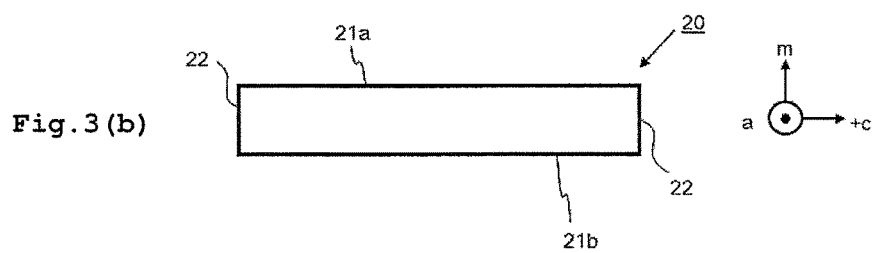

FIG. 3 illustrates a GaN substrate according to a second embodiment. FIG. 3(a) is a plan-view diagram in which a substrate is viewed in the direction of the normal line of a main surface thereof, and FIG. 3(b) is a cross-sectional diagram of FIG. 3(a) at the position of line X-X.

A GaN substrate 20 illustrated in FIG. 3 is a plate having a disk shape, i.e. having a circular main surface. The GaN substrate 20 has a first main surface 21a and a second main surface 21b on the opposite side thereto, and has an end face 22. The first main surface 21a is finished to a flat surface suitable for epitaxial growth of a crystal thereon.

The first main surface 21a is parallel to the M-plane, and accordingly the GaN substrate 20 is an M-plane substrate.

The diameter of the first main surface 21a lies in the range of 45 to 55 mm, and may be for instance 2 inches (50 mm).

The GaN substrate 20 of the second embodiment differs from the GaN substrate 10 according to the first embodiment described above in that the GaN substrate 20 is made up of a single crystal region. That is, no boundaries between crystal regions are present in the GaN substrate 20. There is suppressed as a result the occurrence of crystal defects caused by stress generated at the boundaries between crystal regions.

As illustrated in FIG. 3(a), when the first main surface 21a is divided into an outer peripheral portion 21a-1 (outward of the long dashed line) measuring 3 mm or less from the edge and a central portion 21a-2 (inward of the long dashed line) surrounded by the outer peripheral portion, the average dislocation density of the central portion 21a-2 is lower than $10^5$ cm$^{-2}$.

If an average dislocation density lower than $10^5$ cm$^{-2}$ is realized in the central portion 21a-2 of the first main surface, then at least one square region having a 100 µm side and in which no dark spots are detected in a CL measurement is often observed within each partition, having a 5 mm side, of a plurality of square partitions into which the central portion is divided.

The outer peripheral portion 21a-1 is a portion that is generally not used in the production of a semiconductor device. Also the dislocation density of the outer peripheral portion is preferably low.

The stacking fault density in the central portion 21a-2 of the second main surface is preferably 20 cm$^{-1}$ or lower, more preferably 10 cm$^{-1}$ or lower and most preferably 1 cm$^{-1}$ or lower.

Dislocation density and stacking fault density can be evaluated in accordance with the same methods as in the first embodiment.

The second embodiment of the present invention has been thus explained above. In an alternative embodiment, a low-index plane that is parallel to, or most closely parallel to, the first main surface 21a of the GaN substrate 20 can be set to a crystal plane oblique with respect to the M-plane, for instance the (30-31) plane, (30-3-1) plane, (20-21) plane, (20-2-1) plane or the like.

1.3. Third Embodiment

Figure 17A:
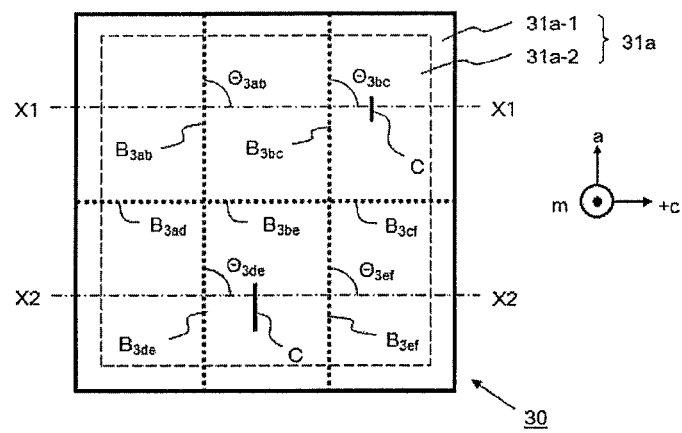
FIG. 17(a) is a plan-view diagram.
Figure 17B:
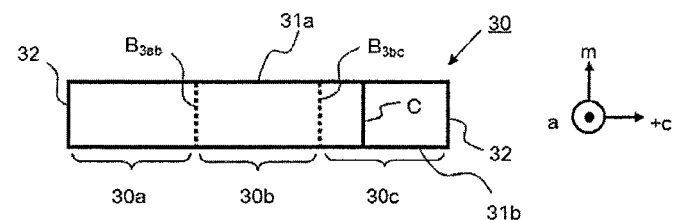
FIG. 17(b) is a cross-sectional diagram of FIG. 17(a) at the position of line X1-X1.
Figure 17C:
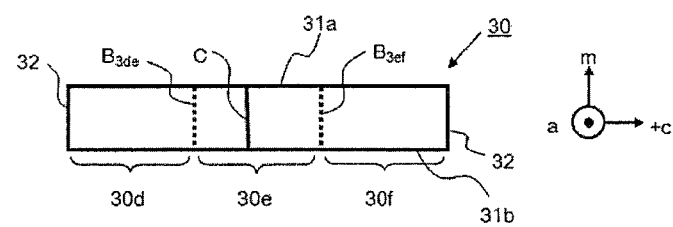
FIG. 17(c) is a cross-sectional diagram of FIG. 17(a) at the position of line X2-X2.

FIG. 17 illustrates a GaN substrate according to a third embodiment. FIG. 17(a) is a plan-view diagram. FIG. 17(b) is a cross-sectional diagram of FIG. 17(a) at the position of line X1-X1, and FIG. 17(c) is a cross-sectional diagram of FIG. 17(a) at the position of line X2-X2. The cross-sections illustrated FIGS. 17(b) and (c) are perpendicular to the main surface.

A GaN substrate 30 illustrated in FIG. 17 is a plate having a rectangular main surface. The GaN substrate 30 has a first main surface 31a and a second main surface 31b on the opposite side thereto, and has an end face 32. The first main surface 31a is finished to a flat surface suitable for epitaxial growth of a crystal thereon.

The first main surface 31a is parallel to the M-plane, and accordingly the GaN substrate 30 is an M-plane substrate. The GaN substrate 30 may be a miscut substrate. The miscut angle can be set to an arbitrary angle of 20° or less. In other words, the first main surface 31a may be parallel to a crystal plane that is inclined by up to 20° with respect to the M-plane.

The size of the first main surface 31a is 4 inches or greater, both longitudinally and transversally. As illustrated in FIG. 17(a), when the first main surface 31a is divided into an outer peripheral portion 31a-1 (outward of the long dashed line) measuring 3 mm from the edge and a central portion 31a-2 (inward of the long dashed line) surrounded by the outer peripheral portion, the dislocation density of the central portion 31a-2, averaged by excluding the boundaries between adjacent crystal regions, is lower than 10$^5$ cm$^{-2}$.

The GaN substrate 30 is cut out of a GaN crystal produced in accordance with a tiling method, and includes six crystal regions 30a, 30b, 30c, 30d, 30e, 30f arrayed in the c-axis direction and a-axis direction. The a-axis is a crystal axis parallel to [11-20].

All the six crystal regions 30a, 30b, 30c, 30d, 30e, 30f are exposed at both the first main surface 31a and the second main surface 31b. In FIG. 17(a) the boundaries between adjacent crystal regions appearing on the first main surface 31a are depicted with dotted lines. The boundaries between adjacent crystal regions appearing on a cross-section are similarly depicted with dotted lines in FIGS. 17(b) and (c).

A boundary $B_{3ab}$ is present between the crystal regions 30a and 30b, a boundary $B_{3bc}$ is present between the crystal regions 30b and 30c, a boundary $B_{3ad}$ is present between the crystal regions 30a and 30d, a boundary $B_{3be}$ is present between the crystal regions 30b and 30e, a boundary $B_{3cf}$ is present between the crystal regions 30c and 30f, a boundary $B_{3de}$ is present between the crystal regions 30d and 30e, and a boundary $B_{3ef}$ is present between the crystal regions 30e and 30f.

The boundaries between adjacent crystal regions appear on the first main surface 31a in the form of band-like regions having locally higher dislocation density, in a cathode luminescence image. The width of the band-like regions is ordinarily smaller than 200 μm, preferably smaller than 100 μm.

Photoluminescence (PL) intensity drops relatively at regions of high dislocation density, and hence the boundaries between adjacent crystal regions may be ascertained through PL mapping of the first main surface 31a.

In most cases the crystal orientation varies slightly between adjacent crystal regions, with the crystal orientation changing discontinuously at the boundary. Sites of discontinuous change in crystal orientation can be detected for instance through X-ray topography analysis of the first main surface 31a.

In FIG. 17(a), angles $\Theta_{3ab}$, $\Theta_{3bc}$, $\Theta_{3de}$ and $\Theta_{3ef}$ lie in the range of 80 to 100°, taking lines X1-X1 and X2-X2 as parallel to the c-axis. In other words, the boundaries $B_{3ab}$, $B_{3bc}$, $B_{3de}$ and $B_{3ef}$ extend in directions that form an angle in the range of 90°±10° with the c-axis. The range of the angle formed by the directions in which the boundaries $B_{3ab}$, $B_{3bc}$, $B_{3de}$ and $B_{3ef}$ extend with respect to the c-axis is preferably 90°±5°, and more preferably 90°±1°.

Through-cracks C are present in the GaN substrate 30. The through-cracks C are cracks running through the substrate in the thickness direction, with the angle formed by the through-cracks C and the c-axis lying in the range of 90°±10° within the first main surface 31a. The number of the through-cracks C in the first main surface 31a is preferably 10 or fewer per 20 cm$^2$. Most preferably, there are no through-cracks C in the first main surface 31a.

Preferably, cracks of type other than the through-cracks C are absent in the first main surface 31a.

1.4. Preferred Embodiment

In the above embodiments the boundary between the first main surface and the end face may be chamfered as needed to make the boundary smoother. The same applies to the boundary between the second main surface and the end face. In a case where the boundary between the first main surface and the end face is to be chamfered, it suffices to define the outer peripheral portion and central portion described above with respect to the edge of the first main surface before chamfering.

An orientation flat that indicates the orientation of the crystal and/or an index flat for enabling identification of the two main surfaces can also be provided, as needed.

Although the main surface of the GaN substrates according to the embodiments is not limited to being circular or rectangular, the area of the main surface is comparable to or greater than the area of a circle having ordinarily a diameter of 2 inches, preferably a diameter of 3 inches and more preferably a diameter of 4 inches.

In the case of a disk-shaped GaN substrate, the diameter is ordinarily 2 inches or greater, preferably 3 inches or greater and more preferably 4 inches or greater. The diameter has no particular upper limit, but is ordinarily 6 inches or smaller.

Therefore, the diameter of the GaN substrate of the first or second embodiment can be expanded for instance to 75 mm (3 inches), 100 mm (4 inches), 150 mm (6 inches) or the like.

In a case where the shape of the main surface is a rectangle such as the GaN substrate according to the third embodiment, the size of the main surface is preferably 2 inches or greater, more preferably 3 inches or greater and yet more preferably 4 inches or greater, both longitudinally and transversally. The longitudinal and transversal length has no particular upper limit, but is ordinarily 6 inches or smaller.

In a GaN substrate made up of a plurality of crystal regions, as in the GaN substrates according to the first and third embodiments, preferably at least one of the plurality of crystal regions has a size of 15 mm or greater along the direction of an orthogonal projection of the c-axis on the main surface. More preferably, all of the plurality of crystal regions have a size of 15 mm or greater along the above direction.

A configuration wherein the plurality of crystal regions is arrayed in two rows in the direction of an orthogonal projection of the c-axis on the main surface, as in the GaN substrate according to the third embodiment, can also be used in a disk-shaped GaN substrate. Such a configuration can be used, particularly preferably, in a disk-shaped GaN substrate having a diameter of about 4 inches (95 to 105 mm) to about 6 inches (145 to 155 mm).

In a disk-shaped GaN substrate having a diameter of about 6 inches a configuration can also be adopted wherein the plurality of crystal regions is arrayed in three rows along the direction of an orthogonal projection of the c-axis on the main surface.

In a GaN substrate having thus a configuration in which the crystal regions are arrayed in two rows or three rows in the direction of an orthogonal projection of the c-axis on the main surface, the number N of crystal regions in each row varies depending on the size of the substrate. Specifically, in a case where the substrate size along the direction of an orthogonal projection of the c-axis on the main surface is about 4 inches, the number N is preferably 2 to 8, more preferably 2 to 4. In a case where the size is about 6 inches, N is preferably 3 to 12, more preferably 3 to 6.

2. Method for Producing a GaN Substrate (I)

An example of a method for producing the GaN substrate according to the first embodiment will be explained next with reference to accompanying drawings.

2.1. Production of Seed Substrates for a Tiling Method

Seed substrates for a tiling method can be produced in accordance with the following procedure.

(i) There is prepared of a C-plane substrate made up of a GaN crystal (primary GaN crystal) grown by HVPE.

(ii) Using the C-plane substrate prepared in step (i) as a seed, a secondary GaN crystal is grown by an ammonothermal method, to produce an M-plane substrate out of the secondary GaN crystal.

(iii) A tertiary GaN crystal is grown by an ammonothermal method using the M-plane GaN substrate produced in step (ii) as a seed.

(iv) Seed substrates for a tiling method are produced from the tertiary GaN crystal having been grown in step (iii).

Three important points apply to the growth of the secondary GaN crystal in step (ii) above.

Firstly, the secondary GaN crystal is grown on an N-polar surface of the C-plane GaN substrate. The N-polar surface, which is the main surface on the [000-1] side, is also referred to as a nitrogen-polar surface, nitrogen surface or the like.

Secondly, a growth mask having a specific pattern described below is formed on the N-polar surface of the C-plane GaN substrate, before growth of the secondary GaN crystal.

Thirdly, there is used an acidic mineralizer.

By implementing these three points it becomes possible to grow the secondary GaN crystal, having low strain in the crystal structure, at a higher rate and up to a larger size. The area of the seed substrate for a tiling method that is produced in step (iv) can be increased as a result.

Step (iii) as well has major significance.

The reason underlying the need for step (iii) is that the M-plane substrate that is produced in step (ii) does not withstand the temperature conditions that apply during the growth of a GaN crystal by a vapor phase method. The GaN crystal grown in step (ii) has a large amount of voids in the interior thereof, and accordingly cracks or becomes altered when exposed at high temperature in the vicinity of 1000° C.

By contrast, the M-plane GaN substrate produced in step (ii) can be used as a seed in an ammonothermal method, since the GaN crystal can be grown at 650° C. or below.

The GaN crystal obtained in step (iii) has little strain and has enough heat resistance as to allow the GaN crystal to be used as a seed in vapor-phase growth of GaN.

The various steps are explained in detail next.

(i) Preparation of a C-Plane GaN Substrate

The C-plane GaN substrate can be produced through growth of a bulk GaN crystal by HVPE, using as a seed a sapphire substrate, a GaAs substrate or the like, and by processing then the bulk GaN crystal.

Preferably there is produced a C-plane GaN substrate having a diameter of 2 inches or greater, using a seed having a diameter larger than 2 inches.

The crystal growth apparatus and growth conditions that are utilized in HVPE are well known to a person skilled in the art. A technique for growing a bulk GaN crystal by HVPE on a GaAs substrate can be found for instance in WO 99/023693 (or U.S. Pat. No. 6,693,021 corresponding thereto). A technique for growing a bulk GaN crystal by HVPE on a sapphire substrate can be found, for instance, in Japanese Patent Application Publication No. 2003-178984 (or US Patent Publication No. 2002/0197825 corresponding thereto) and Japanese Patent Application Publication No. 2007-277077 (or US Patent Publication No. 2009/0081110 corresponding thereto).

The N-polar surface of the C-plane GaN substrate is finished by CMP (Chemical Mechanical Polishing), for planarization and damaged layer removal.

The shape of the C-plane GaN substrate is not limited to a disk, and may be a rectangular plate or the like.

(ii) Growth of a Secondary GaN Crystal and Production of an M-Plane GaN Substrate A growth mask for limiting a region in which crystal growth can take place is formed on the N-polar surface of the C-plane GaN substrate prepared in step (i) above.

Figure 4:
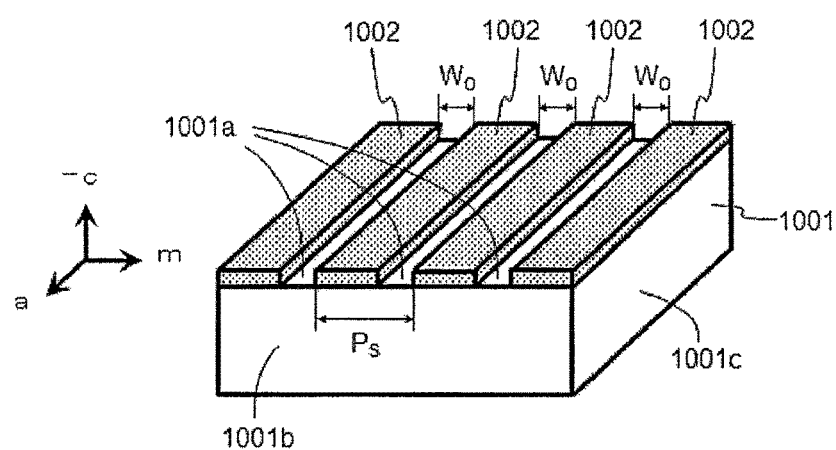
FIG. 4 is a perspective-view diagram illustrating a C-plane GaN substrate having a striped-pattern growth mask formed on a N-polar surface.

FIG. 4 is a schematic diagram illustrating an example of a C-plane GaN substrate having a growth mask formed thereon. The C-plane GaN substrate 1001 has rectangular N-polar surfaces 1001a. A growth mask 1002 having a striped pattern (line and space pattern) parallel to the a-axis, and having linear openings of width $W_O$ in the range of about 50 to 100 μm, is disposed on the N-polar surfaces 1001a. The stripe period $P_S$ is preferably set to be greater than 1 mm, and preferably equal to or smaller than 10 mm.

End faces 1001b of the C-plane GaN substrate in the a-axis direction and end faces 1001c in the m-axis direction must not be covered by the growth mask. As an example, the outer periphery of the N-polar surface may be exposed over an area of up to several mm from the substrate end face.

The growth mask is formed of a metal that does not dissolve or decompose during growth of the GaN crystal by an ammonothermal method, for instance Al, W, Mo, Ti, Pt, Ir, Ag, Au, Ta, Ru, Nb and Pd, or alloys thereof.

The feedstock used in the ammonothermal method is preferably polycrystalline GaN. The concentration of oxygen contained as an impurity in the polycrystalline GaN is preferably $5 \times 10^{19}$ cm$^{-3}$ or lower. The amount of impurities of water, oxygen or the like in the ammonia that is used as a solvent is preferably 0.1 ppm or smaller. An acidic mineralizer is used as the mineralizer. Preferred examples of the acidic mineralizer include, for instance, acidic mineralizers that contain a halogen element, for instance ammonium halides, gallium halides and hydrogen halides. Particularly preferred is the concomitant use of ammonium fluoride and hydrogen iodide. The purity of the mineralizer is preferably 99.99% or higher.

Details on the configuration of the crystal growth apparatus and the crystal growth conditions that are resorted to in an ammonothermal method can be found for instance in WO 2011/065436 (or US Patent Publication No. 2012/0237431 corresponding thereto) and WO 2013/062042 (or US Patent Publication No. 2013/0108537 corresponding thereto).

The growth vessel used is a sealed pressure vessel having a feedstock dissolution zone and a crystal growth zone provided in the interior of the vessel. During crystal growth, the pressure inside the growth vessel lies preferably in the range of 200 to 220 MPa, and the temperature inside the growth vessel lies preferably in the range of 590 to 630° C. The temperature difference between the feedstock dissolution zone and the crystal growth zone lies preferably in the range of 5 to 20° C. The feedstock dissolution zone is set to a higher temperature than that of the crystal growth zone.

Figure 5:
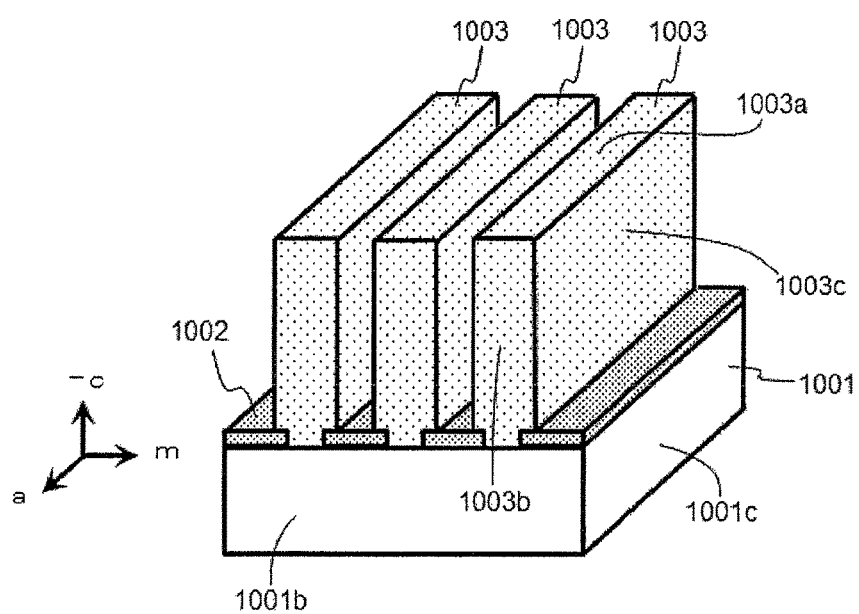
FIG. 5 is a perspective-view diagram illustrating the manner of growth of a GaN crystal on a C-plane GaN substrate having a striped-pattern growth mask formed on a N-polar surface.

FIG. 5 illustrates schematically the manner in which the secondary GaN crystal grows. In FIG. 5, secondary GaN crystals 1003 are grown one by one, in the form of a wall, on each opening of the growth mask 1002. The height direction of the walls is the [000-1] direction (-c direction) and the thickness direction of the walls is the m-axis direction. Although the walls grow in the thickness direction as well, it is unlikely for adjacent walls to become fused together. The thickness of the walls may be 1 mm or greater, but is constrained by the stripe period $P_S$ of the growth mask 1002.

The interfaces between the secondary GaN crystals 1003 and the C-plane GaN substrate 1001 are limited within the elongate openings that are provided in the growth mask 1002, and hence it becomes possible to suppress the influence that stress generated in the interfaces exerts on the growth of the secondary GaN crystal.

Figure 6:
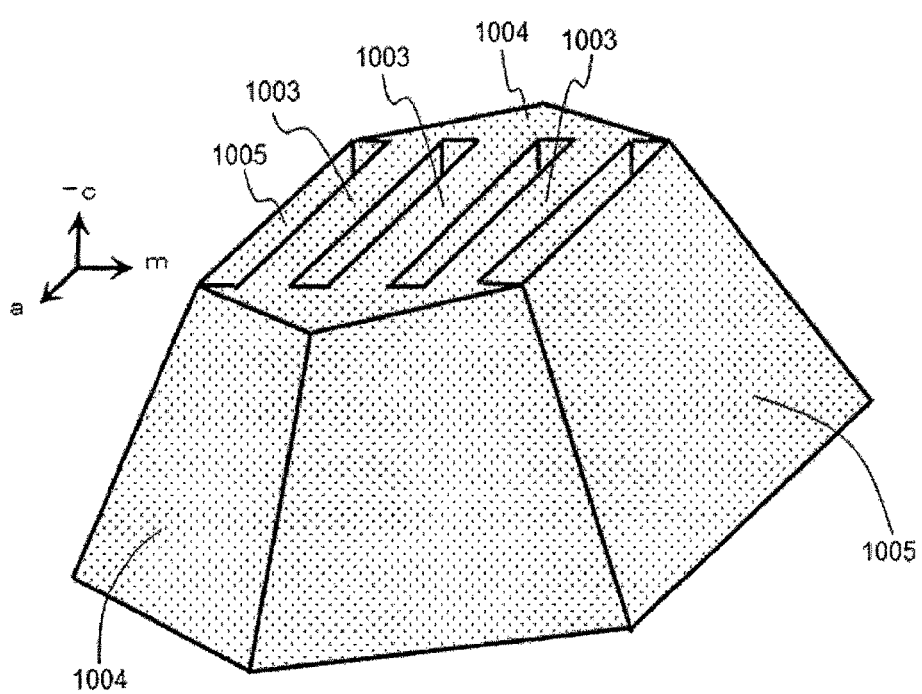
FIG. 6 is a perspective-view diagram illustrating a structure in which a GaN crystal is ammonothermally grown on a C-plane GaN substrate having a striped-pattern growth mask formed on a N-polar surface.

Although not depicted in FIG. 5, a GaN crystal grows also from the end faces of the C-plane GaN substrate 1001, and hence the structure schematically illustrated in FIG. 6 becomes formed as a whole.

The GaN crystal that grows from the end portions 1001b of the C-plane GaN substrate in the a-axis direction forms walls 1004 that extend in the [000-1] direction and have an oblique outer surface. End portions 1003b of the secondary GaN crystal in the a-axis direction are joined to the inner surface of the walls 1004.

The GaN crystal as well that grows from end portions 1001c of the C-plane GaN substrate in the m-axis direction forms walls 1005 that extend in the [000-1] direction and have an oblique outer surface. The walls 1004 and the walls 1005 are joined to one another, forming thereby a peripheral wall structure that surrounds the secondary GaN crystals 1003.

At least the following three effects are elicited through formation of the structure illustrated in FIG. 6.

The first effect is the effect of holding the secondary GaN crystal on the C-plane GaN substrate.

The second effect is the effect of preventing slowdown of the growth rate of the secondary GaN crystal in the [000-1] direction.

The third effect is the effect of preventing reduction of the size of the secondary GaN crystal in the a-axis direction.

The first effect allows for regrowth in the growth process of the secondary GaN crystal. The term regrowth denotes an operation of removing a seed from the growth vessel once a crystal has grown to some extent, transferring the seed to a new growth vessel, and growing a crystal again on the seed. The growth rate decreases along with feedstock consumption in the growth vessel, and hence regrowth is necessary in order to obtain a large secondary GaN crystal. The formation of the structure illustrated in FIG. 6 allows for such regrowth.

If this structure is not formed, it is difficult to transfer the secondary GaN crystal from a used growth vessel to a new growth vessel without the secondary GaN crystal falling off the C-plane GaN substrate. That is because direct joining between the secondary GaN crystal and the C-plane GaN substrate is limited to the interior of the elongate openings that are provided in the growth mask, as described above.

When the structure illustrated in FIG. 6 is formed the secondary GaN crystal becomes tethered to the C-plane GaN substrate via the peripheral wall structure. Regrowth is enabled as a result and the probability of detachment of the secondary GaN crystal from the C-plane GaN substrate in the growth vessel, on account for instance of the action of solvent convection, is significantly reduced.

The peripheral wall structure illustrated in FIG. 6 elicits also the effect of protecting the secondary GaN crystal against damage during handling.

A modelized explanation of the above second effect is as follows.

Figure 7A:
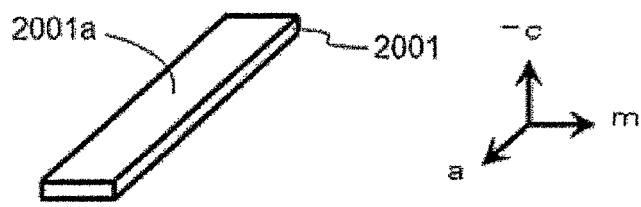
FIG. 7(a) illustrates a seed substrate before growth of a GaN crystal.

In a conceivable instance, for example, a GaN crystal is grown using a GaN crystal seed 2001 illustrated in FIG. 7(a). A main surface 2001a of this seed is an N-polar surface and has a rectangular shape that extends elongately in the a-axis direction.

Figure 7B:
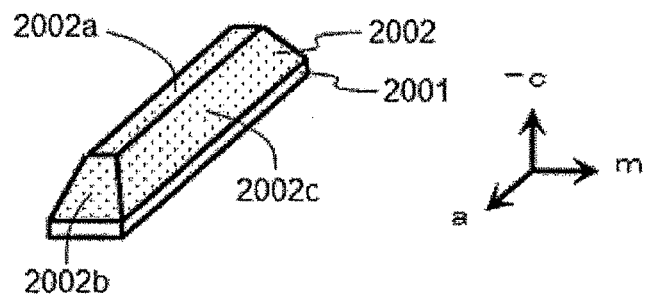
FIG. 7(b) illustrates a stable facet that appears on the surface of a GaN crystal that is grown on the seed substrate.

Immediately after the start of growth, a GaN crystal grows at a high rate, on the N-polar surface of the seed; however, stable facets 2002b and 2002c appear at an early stage on the surface of the GaN crystal 2002, as illustrated in FIG. 7(b). The stable facets 2002b and 2002c are both tilted with respect to the [000-1] direction, which is the growth direction of the GaN crystal 2002. Accordingly, the N-polar surface 2002a of the GaN crystal becomes narrower as crystal growth progresses.

Figure 7C:
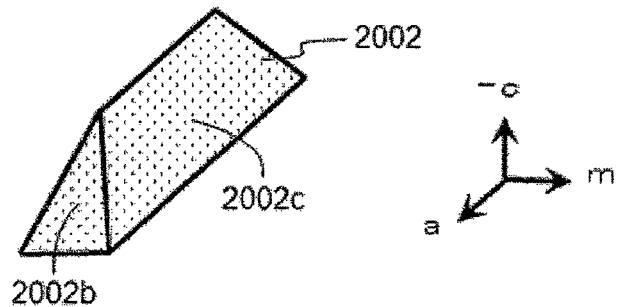
FIG. 7(c) illustrates a stable facet that takes up the entire surface of the GaN crystal that is grown on the seed substrate.

Eventually, the entire surface of the GaN crystal is taken up by the stable facets 2002b and 2002c, and the N-polar surface 2002a disappears, as illustrated in FIG. 7(c), whereupon the growth rate of the GaN crystal in the [000-1] direction drops to an impractical level.

In a case where the structure illustrated in FIG. 6 is formed, by contrast, stable facets do not appear readily on the surface of the secondary GaN crystal, and hence there is no slowdown in the growth rate in the [000-1] direction due to the disappearance of the N-polar surface. Therefore, it becomes possible to grow the secondary GaN crystal by 15 mm or more in the [000-1] direction by performing regrowth while keeping the growth rate in that direction at a practical level (for instance, in excess of 100 μm/day).

Regrowth can be repeated two or more times.

The third effect above can be explained on the basis of a comparison with the model illustrated in FIG. 7. In the example of FIG. 7, the size of the GaN crystal 2002 in the a-axis direction decreases as the GaN crystal 2002 grows in the [000-1] direction. That is because the stable facets 2002b that appear on the end portions in the a-axis direction are tilted with respect to the c-axis.

In the case of the structure illustrated in FIG. 6, by contrast, the end portions 1003b of the secondary GaN crystal in the a-axis direction are joined to the walls 1004. Therefore, size reduction of the secondary GaN crystal in the a-axis direction, due to the appearance of the oblique stable facets, does not occur.

By virtue of the above third effect, the size of the secondary GaN crystal in the a-axis direction is roughly determined depending on the size of the C-plane GaN substrate in the a-axis direction. Therefore, a C-plane GaN substrate having a size larger than 50 mm in the a-axis direction is preferably prepared in step (i) above.

A respective M-plane GaN substrate can be then obtained by trimming the shape of each secondary GaN crystal through cutting of the outer periphery of the latter, and through planarization of both main surfaces by lapping and CMP.

The inventors confirmed that M-plane GaN substrates having a 52 mm×52 mm rectangular main surface can be produced by growing secondary GaN crystals in accordance with the above-described method. It is deemed that M-plane GaN substrates having a size equal to or greater than a 55 mm square can be produced by further extending the crystal growth time.

(iii) Growth of a Tertiary GaN Crystal

A tertiary GaN crystal, which constitutes the material of a respective seed substrate for a tiling method, is grown by an ammonothermal method using an M-plane GaN substrate produced in the step (ii) as a seed.

The lower the degree of parallelism between the growth direction of the crystal and the c-axis, the higher becomes the likelihood of occurrence of stacking faults in a GaN crystal. This is not limited to vapor phase growth, and applies also to an ammonothermal methods.

In the tertiary GaN crystal, however, the stacking fault density is very low despite the fact that the degree of parallelism between the growth direction and the c-axis is not high. That is because the tertiary GaN crystal is grown using an M-plane GaN substrate produced from a secondary GaN crystal having very little strain as a seed.

An acidic mineralizer identical to that of the step (ii) can be preferably used in the growth of the tertiary GaN crystal. Preferred crystal growth conditions are identical to those of step (ii).

Although the tertiary GaN crystal is grown so as to cover the entire surface of the M-plane GaN substrate, the portion preferably used as the material of a seed substrate for a tiling method is the M-plane growth portion that is formed on the main surface of the M-plane GaN substrate.

The use of an acidic mineralizer having fluorine, such as ammonium fluoride, is particularly recommended when growing the tertiary GaN crystal. This mineralizer has the effect of significantly enhancing the rate of M-plane growth of GaN crystals. No basic mineralizers have been developed thus far that enable M-plane growth of GaN crystals at a practical rate.

The GaN crystal grown ammonothermally using an acidic mineralizer having fluorine contains thus fluorine, in a concentration that ordinarily exceeds $1 \times 10^{15}$ cm$^{-3}$. The alkali metal concentration of such a GaN crystal is ordinarily lower than $1 \times 10^{15}$ cm$^{-3}$.

(iv) Production of Seed Substrates for a Tiling Method

The seed substrates for a tiling method are formed to a rectangular plate, as in the seed substrates 100 illustrated in FIG. 8, and are provided with a +C-end face and with a −C end face on the [0001]-side (+c-side) and the [000-1]-side (−c-side), respectively. The +C-end face and the −C-end face are set to be parallel to each other and so that each intersects the orthogonal projection of the c-axis on the main surface at an angle in the range of 90°±10°, preferably in the range of 90°±5°, and more preferably in the range of 90°±1°.

Preferably, the size of the main surface of each seed substrate is 55 mm or greater in a direction parallel to the intersection line of the +C-end face and the main surface, and 15 mm or greater in a direction perpendicular to the above intersection line. The thickness of the seed substrate is preferably 250 μm or greater.

To produce a seed substrate from a tertiary GaN crystal there are executed, in this order: (a) slicing, (b) end face formation and (c) main surface planarization, as explained below.

(a) Slicing

A pre-substrate having an angle in the range of 0 degrees to 20 degrees between the normal line of the main surface and the m-axis, is cut out of the tertiary GaN crystal using an ordinary wire saw-slicer. The slicing direction can be checked using an X-ray diffractometer.

(b) End Face Formation

The edges of the pre-substrate are cut off using a dicing saw, to shape the main surface as a quadrangle. The cut surfaces formed in this step constitute the end faces of the seed substrate.

Bringing the surface orientation of the end faces of the seed substrate as close as possible to the design orientation is an important point in terms of reducing through-cracks that are generated on the main surface of the GaN substrate that is the final product. Specifically, the deviation from the design orientation is preferably kept within a range of ±0.1°. To this end, the surface orientation of the end faces that are formed is checked using an X-ray diffractometer every time that the pre-substrate is cut. The direction of the workpiece may be adjusted, for re-cutting, in a case where the deviation from the design orientation exceeds 0.1°. This operation is repeated until an end face is obtained the deviation of which from the design orientation lies within 0.1°.

(c) Main Surface Planarization

Once formation of the end face is complete, the main surface of the seed substrates is planarized through lapping and CMP (Chemical Mechanical Polishing), in this order. Grinding may be carried out instead of or in addition to lapping. Besides eliciting planarization, the purpose of CMP is also to remove the damaged layer that is formed during slicing and lapping.

Lapping and CMP, which are ordinarily carried out during polishing of semiconductor substrates, involve fixing a workpiece (seed substrate) to the surface of a flat plate using a wax.

In a preferred embodiment, a plurality of seed substrates is fixed to a plate with the seed substrates arrayed in close contact in such a manner that the end faces of adjacent seed substrates are in contact with each other. The array direction is set to the direction of an orthogonal projection of the c-axis on the main surface of the seed substrates.

Figure 9:
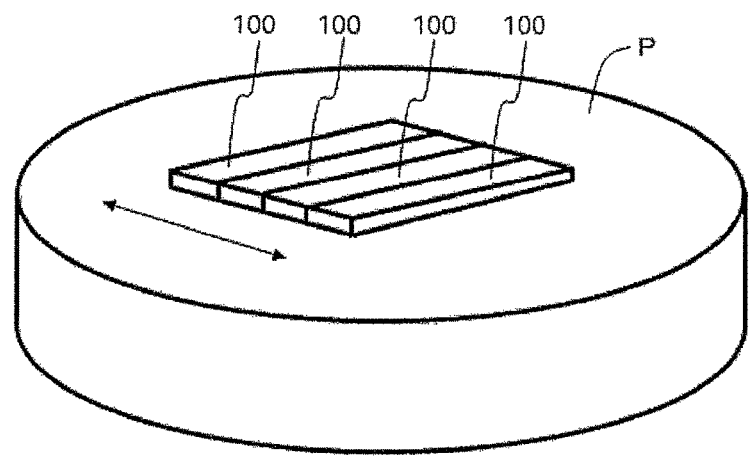
FIG. 9 is a perspective-view diagram illustrating strip-shaped seed substrates fixed to a plate, with the seed substrates arrayed in such a manner that the end faces of adjacent seed substrates are in contact with each other.

FIG. 9 is a perspective-view diagram illustrating the manner in which the seed substrates 100 having a rectangular plate, illustrated in FIG. 8, are arrayed on a plate P. The double-headed arrow in FIG. 9 denotes the direction of an orthogonal projection of the c-axis on the main surface of the seed substrates 100.

Edge roll-off at the +C-end face and the −C-end face of each seed substrate can be suppressed by performing thus lapping and CMP with the plurality of seed substrates arrayed in close contact with each other.

Figure 10A:
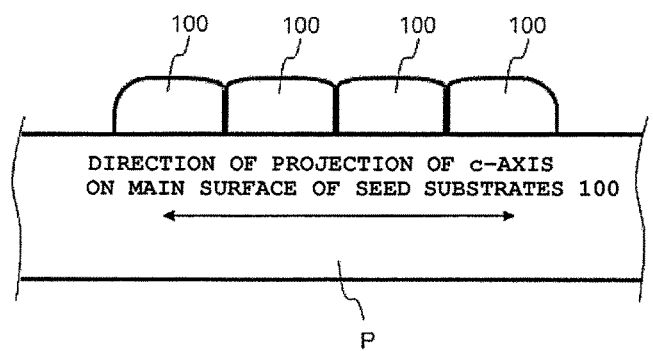
FIG. 10(a) illustrates an instance in which lapping and CMP are carried out with the plurality of seed substrates arrayed such that end faces are in contact with each other.
Figure 10B:
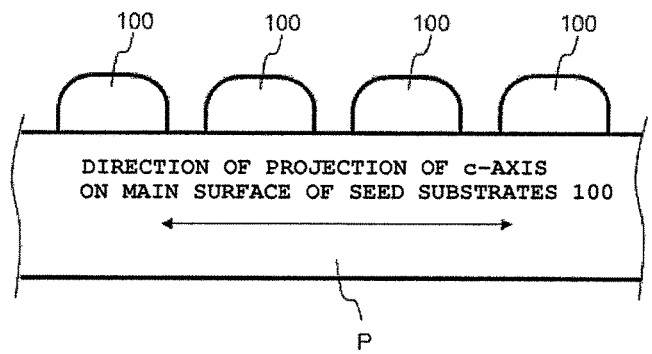
FIG. 10(b) illustrates an instance where lapping and CMP are carried out with the plurality of seed substrates spaced apart from each other.

FIG. 10(a) is a schematic diagram illustrating a cross-section after lapping and CMP of the seed substrates 100 that are fixed onto the plate P, as illustrated in FIG. 9. FIG. 10(b) is a schematic diagram illustrating a cross-section, after lapping and CMP, of an instance where the seed substrates 100 are fixed to the plate P spaced apart from each other.

As illustrated in FIG. 10(a), edge roll-off is suppressed in each seed substrate 100, at the +C-end face in contact with the −C-end face of an adjacent seed substrate, and at the −C-end face in contact with the +C-end face of an adjacent seed substrate. Edge roll-off is not suppressed at the +C-end face and −C-end face that are not in contact with a respective end face of another seed substrate.

2.2. Growth of a GaN Crystal by a Tiling Method

A GaN crystal is vapor-phase grown on an aggregate seed resulting from arraying a plurality of seed substrates produced in accordance with the above-described method. The preferred vapor phase growth method is HVPE.

A normal hot wall-type growth apparatus provided with a reaction vessel made of quartz can be preferably used to grow a GaN crystal by HVPE.

A GaN crystal having very little strain is obtained by using 99 to 100 vol % of nitrogen gas ($N_2$) as the carrier gas that is supplied into the reaction vessel during growth of the GaN crystal by HVPE. The inventors have confirmed that strain in the GaN crystal that is grown is significantly reduced in a case where the ratio of nitrogen gas in the carrier gas is set to 100 vol %, as compared with an instance where the ratio is set to 92 vol % (ratio of $N_2:H_2=92:8$).

The plurality of seed substrates that make up the aggregate seed is arrayed in one row in the direction of an orthogonal projection of the c-axis on the main surface. The orthogonal projections of [0001] on the main surface of all the seed substrates are oriented in the same direction.

Figure 11:
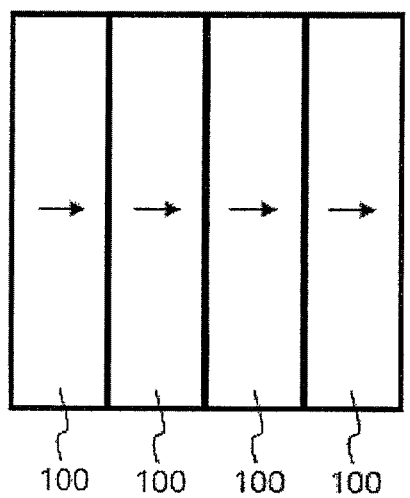
FIG. 11 is a plan-view diagram for explaining the arrangement of a plurality of seed substrates when disposed on a susceptor of a vapor phase growth apparatus.

FIG. 11 is s plan-view diagram illustrating the manner in which seed substrates 100 having a rectangular plate, illustrated in FIG. 8, are arrayed on a susceptor of a vapor phase growth apparatus. The arrows in FIG. 11 indicate the orthogonal projections of [0001] on the main surface of the respective seed substrates 100.

All the four seed substrates 100 illustrated in FIG. 11 are formed in such a manner that the deviation from the design orientation of the +C-end face and the −C-end face is within 0.1°. The crystal orientation deviation among seed substrates, when they are disposed so that the +C-end faces and the −C-end faces come into contact with each other, is accordingly small.

Figure 12A:
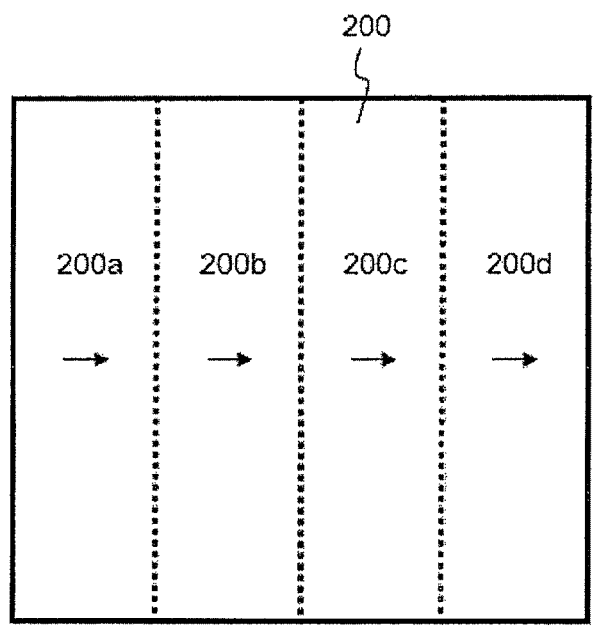
FIG. 12(a) is a plan-view diagram and FIG. 12(b) is a cross-sectional diagram.
Figure 12B:
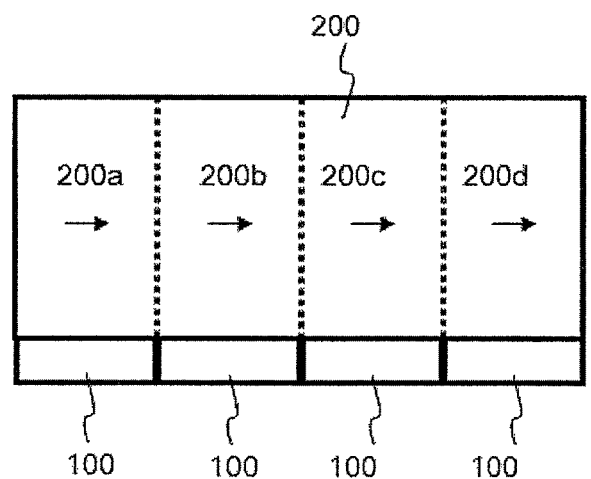

FIG. 12 illustrates the way in which a GaN crystal 200 is epitaxially grown on an aggregate seed made up of four seed substrates 100, where FIG. 12(a) is a plan-view diagram and FIG. 12(b) is a cross-sectional diagram.

Between the four seed substrates 100 there are differences, although slight, in crystal orientation; as a result, four crystal regions 200a, 200b, 200c and 200d (boundaries between crystal regions are indicated by dotted lines) are formed in the GaN crystal 200.

The four arrows in FIGS. 12(a) and (b) denote respective orthogonal projections of [0001] of the GaN crystal 200 onto a virtual plane that is perpendicular to the thickness direction (growth direction) of the GaN crystal 200. The four arrows are substantially parallel, since the differences in crystal orientation among the four crystal regions 200a, 200b, 200c and 200d are slight.

The following differences are revealed in a comparison between a bulk GaN crystal grown by HVPE and a bulk GaN crystal grown by a flux method or an ammonothermal method.

One of the differences is, for instance, the lower alkali metal concentration in a GaN crystal grown by HVPE. In a flux method, for instance, it is difficult to obtain a GaN crystal in which the concentration of alkali metals, including lithium (Li), sodium (Na) and potassium (K), is lower than $1\times10^{15}$ cm$^{-3}$ (Japanese Patent Application Publication No. 2009-18961). The same is true in an ammonothermal method where alkali metals are used as mineralizers (Japanese Patent Application Publication No. 2011-523931). By contrast, a GaN crystal grown by HVPE exhibits ordinarily an alkali metal concentration lower than $1\times10^{15}$ cm$^{-3}$.

Using a crystal having a low alkali metal concentration is advantageous in terms of enhancing the reliability of the semiconductor device that is formed on the substrate.

Further, a GaN crystal grown by HVPE exhibits high transparency in the visible wavelength region, and hence the GaN crystal is suitable as a material of a GaN substrate for light-emitting devices. For instance, the absorption coefficient of a GaN crystal grown by an ammonothermal method lies in the range of 4 to 20 cm$^{-1}$, while the absorption coefficient of a GaN crystal grown by HVPE is 2 cm$^{-1}$ or smaller, at 450 nm, being an emission wavelength of blue LEDs used for excitation in white LEDs (T. Hashimoto, et al., Sensors and Materials, Vol. 25, No. 3 (2013) 155-164).

Further, dopant concentration is controlled more easily in HVPE, and accordingly a GaN crystal can be obtained in which carrier concentration and conductivity are controlled more precisely, than is the case in a flux method or in an ammonothermal method.

2.3. Production of a GaN Substrate

Known technologies can be resorted to as appropriate regarding the method for cutting disk-shaped substrates from a bulk GaN crystal having been grown by a tiling method. For instance, it suffices to subject the bulk GaN crystal to cylindrical grinding or core drilling, to make the main surface of the substrate circular.

The slicing direction of the bulk crystal may be set to parallel to the main surface of the seed substrate, or may be a different direction.

The main surface of the substrate after slicing can be planarized through grinding, lapping, CMP and the like.

FIG. 16 is a cross-sectional diagram illustrating schematically the process of slicing a GaN substrate from a bulk GaN crystal.

Figure 16A:
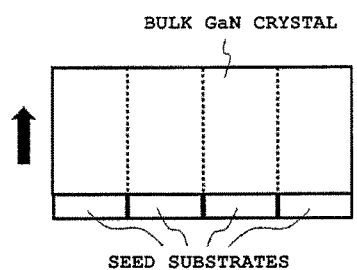
FIG. 16(a) illustrates an aggregate seed made up of four seed substrates, and a bulk GaN crystal epitaxially grown on the aggregate seed.

FIG. 16(a) illustrates an aggregate seed made up of four seed substrates, and a bulk GaN crystal epitaxially grown on the aggregate seed. The growth direction of the bulk GaN crystal is the direction denoted by the arrow in the figure, i.e. a direction away from the seed substrates.

Figure 16B:
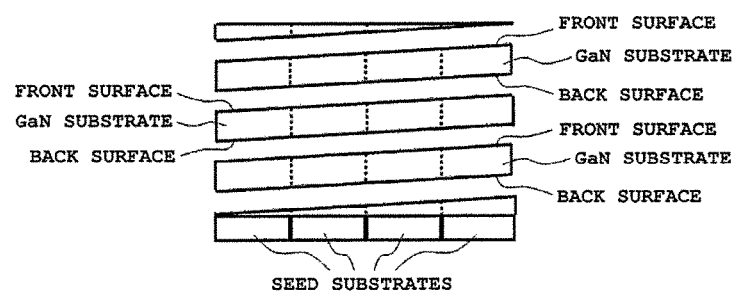
FIG. 16(b) illustrates a state resulting from slicing of the bulk GaN crystal.

FIG. 16(b) illustrates a state resulting from slicing of the bulk GaN crystal. In this example the slicing direction is not parallel to the main surface of the seed substrates.

To produce a GaN substrate the first main surface of which is not a concave surface at room temperature, the main surface oriented in the growth direction of the GaN crystal that makes up the substrate is selected as a first main surface, as illustrated in FIG. 16(b). Damaged layers are removed from the first main surface and the second main surface of the GaN substrate.

The front surface is planarized by mechanical polishing, and the damaged layer generated by the mechanical polishing is removed thereafter. The damaged layer can be removed preferably by CMP.

Multiple dark spots corresponding to dislocations are observed in a cathode luminescence image of the surface of the mechanically polished GaN substrate as it is. When such substrate surface is subjected to CMP, firstly the dark spot density decreases as the amount of CMP increases. After sufficient removal of the damaged layer, the dark spot density remains unchanged even if the amount of CMP is increased.

Damaged layer removal can be accomplished, besides CMP, by RIE (Reactive Ion Etching) using an etching gas that contains a halogen element such as chlorine, fluorine, bromine or the like.

The back surface of the GaN substrate is planarized by mechanical polishing, as needed.

The damaged layer of the back surface of the GaN substrate is preferably removed by RIE.

Non-polar or semi-polar GaN substrates, in particular GaN substrates having an angle in the range of 0° to 20° between the normal line of the front surface and the m-axis, exhibit high chemical stability of the main surface, comparable to that of the Ga polar surface of polar substrates. Accordingly, harsh conditions must be resorted to when removing the damaged layer by wet etching.

2.4. Preferred Embodiment

Even when grown always under the same conditions, the tertiary GaN crystal that is grown in 2.2.(iii) above inevitably exhibits some degree of distribution in the quality of the crystal.

Therefore, when producing in 2.2.(iv) a seed substrate for a tiling method out of a tertiary GaN crystal, the main surface of the as-sliced substrate obtained in step (a) may be polished and planarized before step (b) of end face formation, to evaluate the densities of dislocation defects and of stacking faults of the substrate.

In this evaluation, those substrates in which the densities of dislocation defects and of stacking faults exceed a pre-set criterion are graded as rejects and are not passed onto subsequent step (c); as a result, the quality of the seed substrates that are used in the tiling method can be equalized to a high level.

Rejects in which the portions of locally higher dislocation defect density and/or stacking fault density are present at the edges of the substrate can be restored by cutting off such portions in a next step (b) of end face formation.

2.5. Through-Cracks

The inventors prepared a prototype of a 2-inch diameter M-plane GaN substrate according to the first embodiment, in accordance with the method explained above, and found that through-cracks perpendicular to the c-axis tended to occur.

In particular, numerous through-cracks occurred in a case where the surface orientation of the +C-end face and the −C-end face of the seed substrates used in the tiling method were allowed to have a deviation of about 0.5° from the design orientation.

Figure 13:
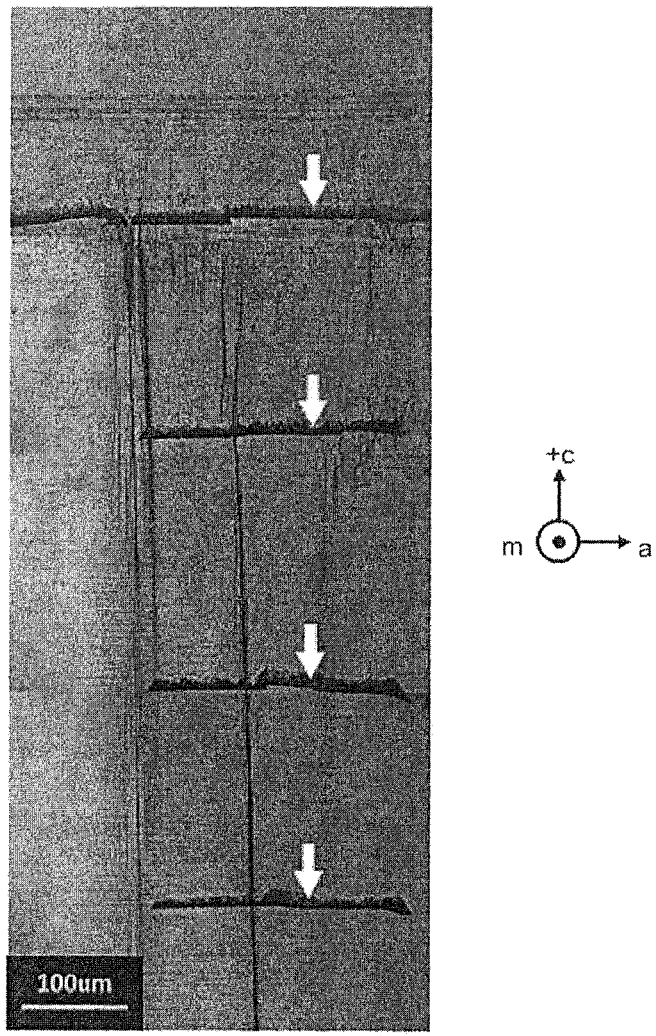
FIG. 13 is a cathode luminescence image of the main surface of a 2-inch M-plane GaN substrate.

FIG. 13 is a cathode luminescence (CL) image of the front surface of the prototype 2-inch M-plane GaN substrate prepared in accordance with the method explained above. As the CL image reveals, through-cracks tended to form rows along the c-axis direction. The white arrows in FIG. 13 denote through-cracks.

The black lines extending in the c-axis direction in FIG. 13 are regions of densely massed dislocations. The through-cracks that formed rows in the c-axis direction were all formed along such linear regions of high dislocation density.

In particular, the internal space of the through-cracks of the GaN substrate illustrated FIG. 13 expanded on account of wet etching using a KOH aqueous solution, during the production process. It is deemed that the width of cracks expands as a result of etching of the N-polar surface having low chemical stability, since fine pyramids are formed only on one of the inner walls.

Such through-cracks were reduced by increasing the precision of the surface orientation of the +C-end face and the −C-end face of the seed substrates. The through-cracks were further reduced by reducing edge roll-off in the +C-end face and the −C-end face of the seed substrates.

These facts suggest that the strain generated at portions where the respective GaN crystals grown from different seed substrates come into contact with each other gives rise to regions of high dislocation density, which in turn are a cause of cracks.

It should be noted herein that when using as the seed substrates of the tiling method GaN crystals of high dislocation density produced by HVPE, numerous cracks appeared on the surface of the obtained 2-inch M-plane substrate, in quantities far greater than those of the above through-cracks. Among the cracks, those parallel to the c-axis and formed at the boundaries between adjacent crystal regions occurred with particularly high frequency.

In other words, by virtue of resorting to the production method described in 2.1 to 2.3 above, the through-cracks perpendicular the c-axis become manifest only through suppression of cracks of other type.

3. Method for Producing a GaN Substrate (II)

A method for producing the GaN substrate according to the second embodiment will be explained next.

The GaN substrate according to the second embodiment can be produced by processing a tertiary GaN crystal the growth method of which has been explained in 2.1.(iii) above.

For instance, to obtain a tertiary GaN crystal of a size that allows cutting out a GaN substrate having a diameter of 50 mm, the size of the main surface of the M-plane seed substrate that is used for growing the tertiary GaN crystal is set to be larger than a 50 mm square. An M-plane seed substrate having a main surface of such size can be produced from the secondary GaN crystal the growth method of which is explained in 2.1.(ii) above.

Since an ammonothermal method using an acidic mineralizer containing fluorine is used for growing the tertiary GaN crystal, the obtained GaN substrate has an alkali metal concentration lower than $1 \times 10^{15}$ cm$^{-3}$, while containing fluorine at a concentration in excess of $1 \times 10^{15}$ cm$^{-3}$.

The GaN substrate of the second embodiment can be produced in accordance with other methods.

For instance, the GaN substrate of the second embodiment can be produced by processing the above-described tertiary GaN crystal, to produce a seed substrate, and processing then a GaN crystal that is grown by HVPE on that seed substrate.

The seed substrate that is produced from the tertiary GaN crystal may be an M-plane substrate, or may be a semi-polar substrate in which an angle between the normal line of the main surface and the m-axis lies in the range of 0 degrees to 20 degrees. The seed substrate may be disk-shaped or may have a rectangular main surface. The size of the main surface of the seed substrate is larger than the size of the main surface of the GaN substrate to be produced.

The alkali metal and fluorine concentrations in the GaN substrate produced in accordance with this method are both lower than $1\times10^{15}$ cm$^{-3}$. The absorption coefficient at the 450 nm wavelength of the GaN crystal that makes up the substrate is 2 cm$^{-1}$ or smaller, and hence the substrate can be suitably used, in particular, as a substrate for blue LEDs.

4. Use of the GaN Substrate

The GaN substrate of the present invention can be used in the production of various types of semiconductor device. Ordinarily, a device structure is formed through vapor-phase epitaxial growth of one or more types of nitride semiconductor on the GaN substrate of the present invention. Epitaxial growth methods suitable for forming a thin film and that can be preferably used include MOCVD, MBE, pulsed vapor deposition and the like.

Specific examples of semiconductor devices include, for instance, light-emitting devices such as light-emitting diodes and laser diodes, electronic devices such as rectifiers, bipolar transistors, field-effect transistors, HEMTs (High Electron Mobility Transistors) and the like, semiconductor sensors such as temperature sensors, pressure sensors, radiation sensors, visible-ultraviolet detectors and the like; as well as SAW (Surface Acoustic Wave) devices, vibrators, resonators, oscillators, MEMS (Micro Electro Mechanical System) components, voltage actuators, solar cells and the like.

The GaN substrate of the present invention can also be used as an electrode for artificial photosynthesis cells.

The GaN substrate of the present invention can be used as a seed for growing a nitride semiconductor crystal.

For instance, a bulk GaN crystal can be obtained through epitaxial growth of GaN, in accordance with an arbitrary method, on the GaN substrate of the present invention. Alternatively, a first bulk GaN crystal can be grown using the GaN substrate of the present invention as a seed, after which a second bulk GaN crystal is grown using as a seed part or the entirety of the first bulk GaN crystal.

5. Experimental Results 5.1. Experiment 1

A 2-inch M-plane GaN substrate was produced in accordance with the procedure below.

[1] Production of a C-Plane GaN Substrate

A GaN crystal layer oriented in the c-axis was grown by HVPE on a GaN template that had been obtained through epitaxial growth of a GaN layer, by MOVPE, on the surface of a C-plane sapphire substrate. The GaN crystal layer was sliced to produce a C-plane GaN substrate. The N-polar surface of the C-plane GaN substrate was planarized through lapping and CMP, in order for the substrate to be used as an underlying surface for epitaxial growth in a subsequent step.

[2] Production of an M-Plane GaN Substrate by an Ammonothermal Method

A growth mask having a striped pattern with 100 μm-wide line-shaped openings was formed, out of a TiW alloy, on the N-polar surface of the C-plane GaN substrate produced in [1] above. The longitudinal direction of the openings, i.e. the stripe direction, was set to be parallel to the a-axis of GaN. A GaN crystal was then grown by an ammonothermal method on the N-polar surface of the C-plane GaN substrate having the mask pattern formed thereon.

The feedstock used was polycrystalline GaN, and the mineralizers that were used were ammonium fluoride (NH$_4$F) and hydrogen iodide (HI).

The charged amount of NH$_4$F and HI was determined in such a manner that the molar ratio of fluorine atoms with respect to NH$_3$ ranged from 0.5 to 1.5%, the molar ratio of iodine atoms with respect to NH$_3$ ranged from 1.5 to 3.5%, and the molar ratio of fluorine atoms with respect to iodine atoms ranged from 0.2 to 0.5.

The growth conditions that were set included an average temperature within the growth vessel (average value of the temperatures in the crystal growth zone and the feedstock dissolution zone) set to lie in the range of 590 to 630° C., temperature difference between the crystal growth zone and the feedstock dissolution zone set to lie in the range of 5 to 20° C., and pressure in the growth vessel set to lie in the range of 200 to 220 MPa.

Upon removal, from the growth vessel, of the C-plane GaN substrate having been held for about 30 days under the above conditions, the structure illustrated in FIG. 6 had been formed by the ammonothermally grown GaN crystal. The GaN crystals grown in the form of walls on the openings of the growth mask were supported by a GaN crystal that constituted a peripheral wall structure surrounding the GaN crystals, and were held on the C-plane GaN substrate. Accordingly, regrowth could be performed thereafter by changing the growth vessel.

For instance a GaN crystal was grown by 20 mm in the [000-1] direction on the openings of the growth mask in a case where the growth time was set to a total of 100 days, by repeating the above growth run three times.

The contour of the GaN crystal was trimmed and the main surfaces of the crystal were planarized and CMP-finished, to produce as a result an M-plane GaN substrate. Among the thus produced M-plane GaN substrates, the size of the main surface of the largest one was 62 mm in the a-axis direction and 17 mm in the c-axis direction.

Next, GaN crystals were grown again by an ammonothermal method using the M-plane GaN substrates produced above, one by one, as seeds. Then M-plane GaN substrates having a thickness of about 330 μm were produced, as seed substrates for a tiling method, out of the GaN crystals having been obtained in the above second ammonothermal growth.

The end faces of the seed substrates were formed through cutting of the GaN crystals using a dicing saw. The main surface of the seed substrates was set to be rectangular with long sides parallel to the a-axis and short sides parallel to the c-axis. Among the seed substrates, the size of the main surface of the largest one was 52 mm in the a-axis direction and 15 mm in the c-axis direction.

Following end face formation, both faces of each of the seed substrates were planarized through lapping and CMP. The polished main surface of the produced seed substrates was checked by SEM-CL, but no dark spots, denoting the presence of basal plane dislocations, were observed within a 90 μm×120 μm field of view, at substantially all sites.

[3] Growth of a GaN Crystal by a Tiling Method

Four seed substrates produced in accordance with the procedure above were arrayed in a row on a susceptor of a HVPE apparatus, in such a manner that +C-end faces the −C-end faces were in contact with each other, to yield an aggregate seed.

Next, ammonia gas and gallium chloride generated by bringing hydrogen chloride into contact with heated metallic gallium were supplied onto the aggregate seed made up of the four seed substrates, to epitaxially grow a GaN crystal. The growth temperature was set to 1050° C. and the growth time to 80 hours. The carrier gas supplied into the reaction furnace during growth was nitrogen gas alone.

[4] Production of an M-Plane GaN Substrate

A disk-shaped M-plane GaN substrate having a diameter of 2 inches (5 cm) and a thickness of about 280 μm was produced by processing the bulk GaN crystal having been epitaxially grown by HVPE on the aggregate seed.

In further detail, the main surface oriented in the growth direction of the GaN crystal, from among the main surfaces of the as-sliced substrate obtained through slicing of the bulk GaN crystal, was set as the front surface, and was planarized through grinding, lapping and CMP in this order. The amount of CMP in the CMP process was set in such a manner that the damaged layer was sufficiently removed.

The damaged layer on the reverse-side main surface (back surface) was removed by reactive ion etching (RIE) using chlorine gas as the etching gas. The conditions involved setting the etching gas supply rate to 50 sccm, the etching power to 140 W/50 W (antenna/bias), the chamber internal pressure to 0.3 Pa, and the etching time to 2000 sec.

The obtained M-plane GaN substrate included four crystal regions corresponding to the four seed substrates.

One or more square regions having a 100 μm side and in which no dark spots were detected in a CL measurement were observed in each square partition, having a 5 mm side, of a plurality of square partitions into which there was divided the central portion of the front surface of the M-plane GaN substrate (portion excluding an outer peripheral portion with a distance of up to 3 mm from the edge).

Next, the contour lines and SORI value of the front surface of the M-plane GaN substrate were measured using a Slating incidence Interference method Flatness Tester FT-17, by NIDEK CO., LTD.; the results revealed that the front surface was a convex surface with a SORI value of 7.9 μm.

Further, only GaN substrates having a convex back surface were obtained when the back surface was subjected to wet etching for 10 minutes at 120° C. using a KOH aqueous solution, instead of by resorting to RIE. The front surface became convex when the etching time was extended to 20 hours, and accordingly it is estimated the damaged layer on the back surface is related to warping.

A measurement of the variation range of the off-angle in the central portion of the front surface of the M-plane GaN substrate yielded 0.14° in the c-axis direction and 0.06° in the a-axis direction.

5.2. Experiment 2

Seed substrates for a tiling method were produced in accordance with the same procedure as in Experiment 1. The main surface of the seed substrates was set to be rectangular with long sides parallel to the a-axis and short sides parallel to the c-axis. The length of the long sides was set to lie in the range of 40 to 60 mm and the length of the short sides in the range of 5 to 15 mm.

The end faces of the seed substrates were formed through cutting of the GaN crystals using a dicing saw. Every time the cutting was carried out in forming each of the end faces, the surface orientation of the formed end face was checked using an X-ray diffractometer. When the deviation from the design orientation exceeded 0.1°, the direction of the workpiece was adjusted and the workpiece was cut again; this operation was repeated until an end face was obtained having a deviation from the design orientation within 0.1°.

Following end face formation, both faces of each of the seed substrates were planarized through lapping and CMP. Next, six seed substrates closely arrayed in the c-axis direction were affixed, using a wax, onto the surface of a flat plate, and lapping and CMP were performed on one main surface of the six seed substrates simultaneously.

The polished main surfaces of the produced seed substrates was checked by SEM-CL, but no dark spots, denoting the presence of basal plane dislocations, were observed within a 90 μm×120 μm field of view, at substantially all sites.

The six seed substrates having been fixed side by side on the plate surface in the above lapping and CMP process were then arrayed closely on a susceptor of an HVPE apparatus, in the same order as when the substrates had been fixed to the plate surface, to yield an aggregate seed.

Next, ammonia gas and gallium chloride generated by bringing hydrogen chloride into contact with heated metallic gallium were supplied onto the aggregate seed made up of the six seed substrates, to epitaxially grow a GaN crystal. The growth temperature was set to 1050° C. and the growth time to 80 hours. The carrier gas supplied into the reaction furnace during growth was nitrogen gas alone.

A disk-shaped M-plane GaN substrate having a diameter of 2 inches (5 cm) and a thickness of about 280 μm was produced by processing the GaN crystal having been epitaxially grown by HVPE on the aggregate seed.

Six crystal regions corresponding to the six seed substrates were formed on the obtained M-plane GaN substrate. One or more square regions having a 100 μm side and in which no dark spots were detected in a CL measurement were observed in each of a plurality of square partitions, having a 5 mm side, into which there was divided the central portion in the main surface, at a distance of more than 3 mm from the edge.

The number of the through-cracks was five, as counted on the basis of an optical image observation of the main surface. The angle formed by the through-cracks with the c-axis was in the range of 90°±10° for all the through-cracks, and the length of the through-cracks was in the range of 0.7 to 3.4 mm. There were detected no cracks of a type different from these five through-cracks.

5.3. Experiment 3

An M-plane GaN substrate was produced and evaluated in the same way as in Experiment 2, but there was omitted the step of closely arraying the six seed substrates and performing lapping and CMP thereon simultaneously.

Six crystal regions corresponding to the six seed substrates were formed on the obtained M-plane GaN substrate. One or more square regions having a 100 μm side and in which no dark spots were detected in a CL measurement were observed in each of a plurality of square partitions, having a 5 mm side, into which there was divided the central portion in the main surface, at a distance of more than 3 mm from the edge.

The number of the through-cracks was 29, as counted on the basis of an optical image observation of the main surface. The angle formed by the through-cracks with the c-axis was in the range of 90°±10° for all the 29 cracks, and the length of the through-cracks was in the range of 0.2 to 5.4 mm. There were detected no cracks of a type different from these 29 through-cracks.

5.4. Experiment 4

An M-plane GaN substrate was produced and evaluated in the same way as in Experiment 2, except for the three points below.

1) The number of seed substrates used in the tiling method was set to 7.

2) There was omitted the step of closely arraying the seed substrates that are used in the tiling method, and performing lapping and CMP simultaneously.

3) During growth of a GaN crystal by HVPE, 43 vol % of the carrier gas supplied into the reaction furnace was set to hydrogen gas and the balance to nitrogen gas.

Seven crystal regions corresponding to the seven seed substrates were formed on the obtained M-plane GaN substrate. One or more square regions having a 100 μm side and in which no dark spots were detected in a CL measurement were observed in each of a plurality of square partitions, having a 5 mm side, into which there was divided the central portion in the main surface, at a distance of more than 3 mm from the edge.

The number of the through-cracks was 43, as counted on the basis of an optical image observation of the main surface. The angle formed by the through-cracks with the c-axis was in the range of 90°±10° for all the 43 cracks, and the length of the through-cracks was in the range of 0.2 to 4.1 mm. There were detected no cracks of a type different from these 43 through-cracks.

5.5. Experiment 5

An M-plane GaN substrate was produced and evaluated in the same way as in Experiment 2, except for the four points below. 1) When forming, using a dicing saw, the end faces of the seed substrates that are used for a tiling method, it was not checked that the deviation from the design orientation was ±0.1° or smaller. The working precision of the dicing saw was ±0.5°.

Figure 14:
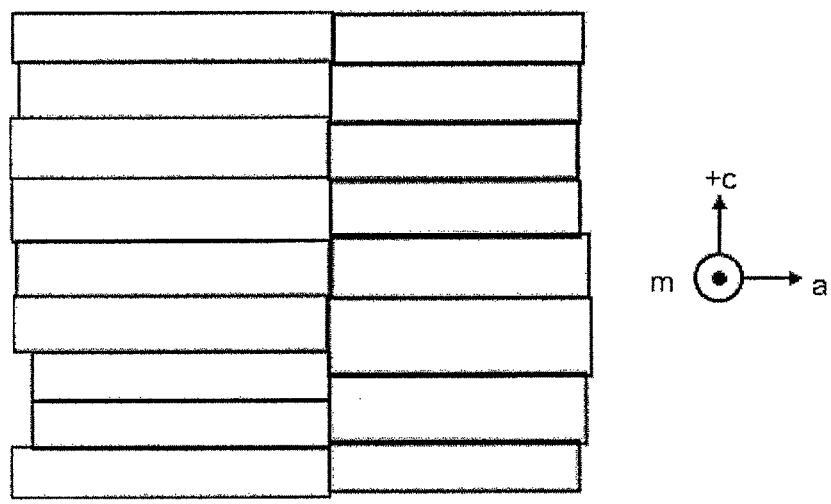
FIG. 14 is a plan-view diagram for explaining the arrangement of 17 seed substrates.

2) The number of seed substrates used in the tiling method was set to 17. The 17 substrates were arrayed as illustrated in FIG. 14.

3) There was omitted the step of closely arraying the seed substrates that are used in the tiling method, and performing lapping and CMP simultaneously.

4) During growth of the GaN crystal by HVPE, 43 vol % of the carrier gas supplied into the reaction furnace was set to hydrogen gas and the balance to nitrogen gas.

In the obtained M-plane GaN substrate there were formed 17 crystal regions corresponding to the 17 seed substrates. One or more square regions having a 100 μm side and in which no dark spots were detected in a CL measurement were observed in each of a plurality of square partitions, having a 5 mm side, into which there was divided the central portion in the main surface, at a distance of more than 3 mm from the edge.

The number of the through-cracks was 99, as counted on the basis of an optical image observation of the main surface. The angle formed by the through-cracks with the c-axis was in the range of 90°±10° for all the through-cracks, and the length of the latter was in the range of 0.1 to 2.6 mm. There were detected no cracks of a type different from these 99 through-cracks.

The results of Experiments 2 to 5 are summarized in Table 1.

TABLE 1

| | Seed substrate | | Number of seed substrates used in tiling method | Carrier gas used in HVPE growth | Number of cracks substantially perpendicular to the c-axis |
| --- | --- | --- | --- | --- | --- |
| | End-face surface orientation precision | Edge roll-off suppression | | | |
| Experiment 2 | ±0.1° | ○ | 6 | $N_2$ | 5 |
| Experiment 3 | ±0.1° | X | 6 | $N_2$ | 29 |
| Experiment 4 | ±0.1° | X | 7 | $H_2/N_2$ | 43 |
| Experiment 5 | ±0.5° | X | 17 | $H_2/N_2$ | 99 |

In Experiment 2 five through-cracks perpendicular to the c-axis occurred on the main surface of the 2-inch M-plane GaN substrate, but it is deemed that that the number of such through-cracks can be further lowered by reducing the number of seed substrates used in the tiling method and by matching with higher precision the surface orientation of the end faces of the seed substrates to the design orientation.

Examples of methods for enhancing the surface orientation precision of the end faces of the seed substrates include a method that involves forming the end faces by dry etching. The orientation of the end faces that are formed can be precisely controlled by resorting to a photolithographic technique to pattern the etching mask.

5.6. Experiment 6

A thick-film GaN crystal layer was grown by HVPE on a 2-inch M-plane GaN substrate, as a seed, having been produced in the same way as in Experiment 1. Next, the seed portion was removed through grinding, and the main surface was subjected to a finishing process, to produce a second-generation 2-inch M-plane GaN substrate.

The second-generation substrate was made up of four crystal regions, similarly to the first-generation substrate that had been used as a seed. It is deemed that the crystal orientation of the seed was carried over to the second-generation substrate. The number of the through-cracks perpendicular to the c-axis was smaller in the second-generation substrate than in the first-generation substrate.

5.7. Experiment 7

There was prepared an M-plane GaN substrate produced in accordance with the same method as that of the seed substrate for a tiling method used in Experiment 1. The shape of the main surface was substantially rectangular, and the size was 52 mm in the a-axis direction and 31 mm in the c-axis direction.

A GaN crystal was epitaxially grown by HVPE using the M-plane GaN substrate as a seed.

Next, the grown bulk GaN crystal was sliced to produce two seed substrates for a tiling method. The two seed substrates were arrayed in such a manner that the +C-end face of one of the seed substrates was in contact with the −C-end face of the other, to yield an aggregate seed. A GaN crystal was grown by HVPE to a thickness of about 5 mm, on the aggregate seed.

The bulk GaN crystal having been grown on the aggregate seed made up of the two seed substrates was worked to produce a disk-shaped M-plane GaN substrate having a diameter of 2 inches (50 mm) and a thickness of 300 μm.

In further detail, the main surface oriented in the growth direction of the GaN crystal, from among the main surfaces of the as-sliced substrate obtained through slicing of the bulk GaN crystal, was set as the front surface, and was planarized through grinding, lapping and CMP in this order, in the same way as in Experiment 1. The amount of CMP in the CMP process was set in such a manner that the damaged layer was sufficiently removed. As in Experiment 1, the damaged layer on the reverse-side main surface (back surface) was removed by RIE using chlorine gas as the etching gas.

The obtained M-plane GaN substrate had two crystal regions corresponding to the two seed substrates.

The contour lines and SORI value of the front surface of the M-plane GaN substrate were measured in the same way as in Experiment 1. The results revealed that the front surface was neither a convex surface nor a concave surface, and that the SORI value was 8.8 μm.

A measurement of the variation range of the off-angle in the central portion (portion excluding the outer peripheral section with a distance of up to 3 mm from the edge) of the front surface of the M-plane GaN substrate yielded 0.24° in the c-axis direction and 0.16° in the a-axis direction.

The present invention has been explained on the basis of specific embodiments, but they are exemplary in character, and are not meant to limit the scope of the present invention in any way. The embodiments described in the present description can be modified in various ways and, where feasible, may be combined with features explained for other embodiments, without departing from the gist of the invention.

REFERENCE SIGNS LIST 10, 20, 30 GaN substrate
11a, 21a, 31a First main surface
11b, 21b, 31b Second main surface
12, 22, 32 End face
100 Seed substrate
200 GaN crystal
C Through-crack
P Plate

The invention claimed is:

1. A GaN substrate, comprising:
a first main surface; and
a second main surface provided on an opposite side from the first main surface, wherein
the GaN substrate has a disk-shape with a diameter of 45 mm or more,
an angle between a normal line of the first main surface and an m-axis is 0° to 20°,
the GaN substrate is made up of n (n being 2, 3 or 4) crystal regions each exposed at both the first main surface and second main surface,
the n crystal regions are arrayed in one row in a direction of an orthogonal projection of a c-axis on the first main surface, and
when the first main surface is divided into an outer peripheral portion measuring 3 mm or less from an edge and a central portion surrounded by the outer peripheral portion, and the central portion is divided into a plurality of square partitions each having a 5 mm side, at least one square region, which has a 100 μm side and in which no dark spots are detected in a CL measurement, is observed within each of the partitions.

2. The GaN substrate according to claim 1, wherein the diameter of the substrate is 55 mm or less.

3. The GaN substrate according to claim 1, wherein a boundary between two adjacent crystal regions, arbitrarily selected from among the n crystal regions, and the orthogonal projection of the c-axis on the first main surface form an angle in a range of 90°±10° within the first main surface.

4. The GaN substrate according to claim 1, wherein there are no through-cracks defined in (A) below running through the substrate in the thickness direction, or even if present, the number of the through-cracks defined in (A) below in the first main surface is 10 or fewer per 20 $cm^2$, and there are no cracks of a type other than the through-cracks defined in (A) below:
(A) a through-crack forming an angle with the orthogonal projection of the c-axis on the first main surface in the range of 90°±10° within the first main surface.

5. The GaN substrate according to claim 1, wherein an average dislocation density in the central portion, obtained through averaging, excluding boundaries between mutually adjacent crystal regions, is lower than $10^5$ $cm^{-2}$.

6. The GaN substrate according to claim 1, wherein the first main surface is not a concave surface at room temperature.

7. The GaN substrate according to claim 6, wherein the first main surface is a convex surface at room temperature.

8. The GaN substrate according to claim 6, wherein a SORI value of the first main surface at room temperature is smaller than 20 μm.

9. The GaN substrate according to claim 1, wherein when the first main surface is divided into an outer peripheral portion measuring 3 mm or less from the edge and a central portion surrounded by the outer peripheral portion, a variation range of an off-angle in the central portion is smaller than 0.5° both for a component in a direction of the orthogonal projection of the c-axis on the first main surface and for a component in a direction perpendicular to the direction.

10. The GaN substrate according to claim 1, comprising stacking faults.

11. The GaN substrate according to claim 1, which comprises a GaN crystal having an alkali metal concentration lower than $1 \times 10^{15}$ $cm^{-3}$ and an absorption coefficient at 450 nm of 2 $cm^{-1}$ or smaller.

12. A method for producing a GaN crystal, the method comprising a step of preparing the GaN substrate according to claim 1, and epitaxially growing GaN thereon.

13. A method for producing a semiconductor device, the method comprising:
preparing the GaN substrate according to claim 1, and growing thereon one or more types of nitride semiconductor layer.

* * * * *